United States Patent
Kageyama

(10) Patent No.: US 8,192,901 B2
(45) Date of Patent: Jun. 5, 2012

(54) GLASS SUBSTRATE-HOLDING TOOL

(75) Inventor: Junichi Kageyama, Chiyoda-ku (JP)

(73) Assignee: Asahi Glass Company, Limited, Tokyo (JP)

( * ) Notice: Subject to any disclaimer, the term of this patent is extended or adjusted under 35 U.S.C. 154(b) by 39 days.

(21) Appl. No.: 12/909,399

(22) Filed: Oct. 21, 2010

(65) Prior Publication Data

US 2012/0100464 A1    Apr. 26, 2012

(51) Int. Cl.
*G03F 1/00* (2006.01)
*G03B 27/62* (2006.01)

(52) U.S. Cl. .............................. 430/5; 355/75

(58) Field of Classification Search .............. 430/5, 311, 430/313, 322, 323, 394; 355/53, 72, 75
See application file for complete search history.

(56) References Cited

U.S. PATENT DOCUMENTS

| 6,352,803 B1 | 3/2002 | Tong et al. |
| 2009/0033907 A1* | 2/2009 | Watson et al. ................. 355/75 |

FOREIGN PATENT DOCUMENTS

JP    2003-501823    1/2003

* cited by examiner

*Primary Examiner* — Stephen Rosasco
(74) *Attorney, Agent, or Firm* — Oblon, Spivak, McClelland, Maier & Neustadt, L.L.P.

(57) ABSTRACT

To provide a glass substrate-holding tool which is capable of avoiding scratching to the deposition surface of a glass substrate and dusting thereby caused as well as scratching and deposition of foreign substances at a center portion of the rear surface of the substrate and which is capable of suppressing dusting from the holding tool itself at the time of forming a multi-layered reflection film and an absorptive layer. A glass substrate-holding tool having, formed on a surface of a flat base, a catching portion for catching and holding by van der Waals forces, wherein the catching portion is in contact with only the periphery of the glass substrate.

24 Claims, 13 Drawing Sheets

GLASS SUBSTRATE-HOLDING TOOL

FIELD OF THE INVENTION

The present invention relates to a glass substrate-holding tool. The glass substrate-holding tool of the present invention is useful for holding a glass substrate during the production of a reflective mask blank for EUV (Extreme Ultra Violet) lithography (hereinafter referred to as "EUV mask blank" in this specification) to be used for e.g. the production of semiconductors, during a mask patterning process at the time of preparing a reflective mask from an EUV mask blank, or during handling of a reflective mask at the time of exposure in EUV lithography.

Further, the present invention relates to a method for producing an EUV mask blank, a method for producing a reflective mask and a method for producing a semiconductor integrated circuit, employing the glass substrate-holding tool of the present invention.

DISCUSSION OF BACKGROUND

In the semiconductor industry, a photolithography method using visible light or ultraviolet light has been employed as a technique for transferring a fine pattern on a silicon substrate or the like, which is required for forming an integrated circuit comprising such a fine pattern. For miniaturization of semiconductor devices, it has been attempted to refine the resolution limit, for example, by a combination of an ArF laser (wavelength: 193 nm) and an immersion method, but such a conventional photolithography method has reached near to the limit. Therefore, as an exposure technique for further miniaturization, EUV lithography is considered to be promising, which is an exposure technique using EUV light having a shorter wavelength than an ArF laser. In this specification, "EUV light" means a light ray having a wavelength in a soft X-ray region or a vacuum ultraviolet ray region, specifically a light ray having a wavelength of from about 10 to 20 nm, particularly about 13.5 nm±0.3 nm.

EUV light is apt to be absorbed by any substances and the refractive indices of substances are close to 1 at this wavelength, whereby it is impossible to use a dioptric system like a conventional photolithography employing visible light or ultraviolet light. For this reason, for EUV light lithography, a catoptric system, i.e. a combination of a reflective photomask and a mirror, is employed.

A mask blank is a stacked member for fabrication of a photomask, which has not been patterned yet. In the case of an EUV mask blank, it has a structure wherein a substrate made of glass or the like has a reflective layer to reflect EUV light and an absorptive layer to absorb EUV light, formed thereon in this order. As the reflective layer, a Mo/Si multilayer reflective film is usually employed wherein a molybdenum (Mo) layer as a high refractive index layer and a silicon (Si) layer as a low refractive index layer are alternately laminated to enhance the light reflectance when the layer surface is irradiated with EUV light.

For the absorptive layer, a material having a high absorption coefficient to EUV light, specifically e.g. a material containing chromium (Cr) or tantalum (Ta) as the main component, is employed.

The multilayer reflective film and the absorptive layer are formed on an optical surface of a glass substrate by e.g. an ion beam sputtering method or a magnetron sputtering method. At the time of forming the multilayer reflection film and the absorptive layer, the glass substrate is held by a holding tool.

As the glass substrate-holding tool, a mechanical chuck and an electrostatic chuck have been used.

Further, a mechanical chuck and an electrostatic chuck have been used as a glass substrate-holding tool also in a mask patterning process at the time of preparing a reflective mask from an EUV mask blank, or at the time of handling a reflective mask during the exposure in the EUV lithography.

However, such glass substrate-holding tools had the following problems.

Mechanical chucks are generally classified into ones to hold a glass substrate by clamping it from both sides and ones to hold a glass substrate by clamping it from its side surface directions. In the former case, the surface of the glass substrate on which the multilayer reflection film or the absorptive layer is formed is clamped, thus leading to a problem such that scratches are likely to be formed on the film-forming surface, or dusting is likely to be caused by such scratching. On the other hand, in the case of the latter, the mechanical chuck is usually larger than the glass substrate in the side surface direction, and during the forming of the multilayer reflective film or the absorptive layer, the amount of film deposition on the chuck itself is likely to increase, which is likely to cause dusting.

On the other hand, in the case of the electrostatic chuck, in order to provide a sufficient holding force, the center portion of the glass substrate is brought in contact with the catching and holding surface of the electrostatic chuck for holding. However, by the contact of the center portion of the rear surface (the rear surface to the film-deposition surface) of the glass substrate with the catching and holding surface of the electrostatic chuck, foreign substances are likely to deposit on the center portion, or scratches are likely to be formed at the center portion. Especially when the electrostatic chuck is used for holding, a problem is likely to occur such that foreign substances are attracted by the residual electric charge or leaking electric field.

The electrostatic chuck is a technique which has been heretofore used to catch and hold a silicon wafer in a process for producing semiconductor devices. However, in the case of substrate having a low dielectric constant and electrical conductivity like a glass substrate, it is required to apply a high voltage in order to obtain a chuck force at a level equivalent in the case of a silicon wafer, whereby there is a possible danger of insulation breakdown. Accordingly, as disclosed in Patent Document 1, an attempt has been made to form a coating with a high dielectric constant and high electrical conductivity on the rear surface of a glass substrate 'hereinafter referred to as a rear surface electroconductive film" in this specification. Here, the rear surface electroconductive film is required to be formed at a position which is in contact with the catching and holding surface of the electrostatic chuck, and it is formed at the center portion on the rear surface of the glass substrate '(e.g. in the case of a glass substrate of 152.4 mm×152.4 mm, at a region of 146 mm×146 mm at its center). If foreign substances, particularly foreign substances with a size of at least 200 nm, are deposited on the center portion of the rear surface of the glass substrate, an electroconductive film on the rear surface is likely to be damaged. Further, by such a damage of the electroconductive film on the rear surface, new foreign substances are likely to be formed. Further, if foreign substances are deposited on the rear surface of the glass substrate, the foreign substances detached from the rear surface of the glass substrate are likely to deposit on the film deposition surface of the glass substrate or on the film deposition device (e.g. at electrode portions of the electrostatic chuck), during transportation of the glass substrate, or in various processes such as cleaning, inspection, etc. to be carried out in the process for producing an EUV mask blank. In a case where foreign substances are deposited on electrode portions of the electrostatic charge in the film deposition apparatus, when such a film deposition apparatus is used next time, the electrode portions in such a state that foreign substances are deposited, will be in contact with a rear surface electroconductive film formed on the rear surface of a fresh glass substrate, such being problematic. Also at the time of preparing a reflective mask from an EUV mask blank, deposition of foreign substances on the electrode portions of the electrostatic chuck in the exposure apparatus, is problematic in that the glass substrate is likely to undergo warpage, and the exposure pattern is likely to be deformed.

PRIOR ART DOCUMENT

Patent Document

Patent Document 1: JP-A-2003-501823 (U.S. Pat. No. 6,352,803)

DISCLOSURE OF THE INVENTION

Object to be Accomplished by the Invention

In order to solve the above-described problems of the prior art, it is an object of the present invention to provide a glass substrate-holding tool which is capable of avoiding scratching to the deposition surface of a glass substrate and dusting thereby caused as well as scratching and deposition of foreign substances at a center portion of the rear surface of the substrate and which is capable of suppressing dusting from the holding tool itself at the time of forming a multi-layered reflection film and an absorptive layer; and a method for producing an EUV mask blank, a method for producing a reflective mask and a method for producing a semiconductor integrated circuit, employing such a glass substrate-holding tool.

Means to Accomplish the Object

In order to accomplish the above object, the present invention provides a glass substrate-holding tool (1) to catch and hold a glass substrate, which comprises a base being flat at least at its surface, and a catching portion provided on at least at a part of the base, wherein:

the catching portion has a surface structure and flexibility capable of catching the glass substrate by van der Waals forces, when it is brought in contact with the glass substrate, and the catching portion satisfies the following (a) and (b):

(a) when the length of one side of the glass substrate is represented by L (mm), the catching portion is in contact with only the periphery of the glass substrate with a distance of at most 1/5 L from the edge of the glass substrate, (b) when the mass of the glass substrate is represented by T (g), the catching force $F_0$ per unit surface area (gf/mm$^2$) of the catching portion and the total contact area S(mm$^2$) of the catching portion to the glass substrate are selected so that the substrate-catching force F (gf) by the catching portion be $F=\alpha \times T$ ($1 \leq \alpha \leq 200$).

Further, the present invention provides a glass substrate-holding tool (2) to catch and hold a glass substrate, which comprises a base being flat at least at its surface, and a catching portion provided on at least at a part of the base, wherein:

the catching portion has a surface structure and flexibility capable of catching the glass substrate by van der Waals forces, when it is brought in contact with the glass substrate, and the catching portion satisfies the following (c) to (e):

(c) when the length of one side of the glass substrate is represented by L (mm), the catching portion is in contact with only the periphery of the glass substrate with a distance of at most 1/5 L from the edge of the glass substrate, (d) the catching force $F_0$ per unit surface area of the catching portion is from 0.0225 to 16.5 gf/mm$^2$, (e) the total contact area S of the catching portion to the glass substrate is at least 20 mm$^2$.

Hereinafter, in this specification, the glass substrate-holding tools (1) and (2) of the present invention may generally be referred to as the glass substrate-holding tool of the present invention.

In the glass substrate-holding tool of the present invention, the catching portion preferably has such a nature that when it is exposed to the air, its surface is positively charged.

In the glass substrate-holding tool of the present invention, the catching portion is preferably made of a silicone resin.

In the glass substrate-holding tool of the present invention, the catching portion preferably has such a structure that it has, at its surface, pillars having lengths of from 0.1 nm to 2,000 nm, diameters of at most 400 nm and aspect ratios of at least 2.5 at a density of from $10^5$ to $10^{12}$ pillars/cm$^2$.

In the glass substrate-holding tool of the present invention, the catching portion may have a plurality of contact sites to the glass substrate.

The glass substrate-holding tool of the present invention preferably has a lifting up mechanism to lift the glass substrate up to release it from the catching portion.

The glass substrate-holding tool of the present invention preferably has a shielding component to cover the side surface of the glass substrate and the periphery of the upper surface of the glass substrate.

The glass substrate-holding tool of the present invention may further have a side surface-catching portion to catch and hold the side surface of the glass substrate by van der Waals forces.

Further, the present invention provides a method for producing a reflective layer-provided substrate for EUV lithography (EUVL) having an EUV light reflective layer formed on one surface of a glass substrate, which comprises holding the glass substrate by the glass substrate-holding tool of the present invention, when the reflective layer is formed on the glass substrate by a dry deposition method.

Further, the present invention provides a method (1) for producing a reflective mask blank for EUV lithography (EUVL) having an EUV light reflective layer and an EUV light absorptive layer formed at least in this order on one surface of a glass substrate, which comprises holding the glass substrate by the glass substrate-holding tool of the present invention, when at least one of the reflective layer and the absorptive layer is formed on the glass substrate by a dry deposition method.

Further, the present invention provides a method (2) for producing a reflective mask blank for EUV lithography (EUVL) having an EUV light reflective layer and an EUV light absorptive layer formed at least in this order on one surface of a glass substrate, and having an electroconductive film formed on the other surface of the glass substrate, which comprises holding the glass substrate by the glass substrate-holding tool of the present invention, when at least one of the electroconductive film, the reflective layer and the absorptive layer is formed on the glass substrate by a dry deposition method.

Further, the present invention provides a method for producing a reflective mask for EUVL, which comprises patterning an EUV light absorptive layer of a reflective mask blank for EUV lithography (EUVL) having an EUV light reflective layer and the EUV light absorptive layer formed at least in this order on one surface of a glass substrate, to obtain a reflective mask for EUVL, wherein the glass substrate is held by the glass substrate-holding tool of the present invention, when the absorptive layer is patterned.

Further, the present invention provides a method for producing a semiconductor integrated circuit, which comprises exposing an object to be exposed, by means of a reflective mask for EUV lithography (EUVL) having an EUV light reflective layer and an EUV light absorptive layer formed at least in this order on one surface of a glass substrate, and having the absorptive layer patterned, to obtain a semiconductor integrated circuit, wherein the glass substrate is held by the glass substrate-holding tool of the present invention, when the object to be exposed, is exposed by means of the reflective mask for EUV lithography (EUVL).

Advantageous Effects of the Invention

The glass substrate-holding tool of the present invention catches and holds only the rear surface of the glass substrate, whereby it is possible to avoid scratching to the deposition surface of the glass substrate and dusting thereby caused. Further, in the production of an EUV mask blank, a mechanism to directly clamp the substrate such as a mechanical chuck, is not present, whereby it is possible to prevent dusting from the glass substrate-holding tool itself during the film deposition.

The glass substrate-holding tool of the present invention catches and holds only the periphery of the rear surface of the glass substrate, whereby it is possible to avoid deposition of foreign substances or scratching to the center portion of the rear surface of the glass substrate (e.g. in the case of a substrate of 152.4 mm×152.4 mm, to a region of 146 mm×146 mm at the center portion of the substrate).

The glass substrate-holding tool of the present invention does not require application of high voltage to produce a strong electrostatic power like an electrostatic chuck and catches and holds a glass substrate by van der Waals forces at the catching portion and electrostatic attraction (when the catching portion is positively-charged), whereby there will be no possibility of a problem of attracting foreign substances by a residual electric charge or leaking electric field which may happen when a glass substrate is catched and held by an electrostatic chuck.

According to a method for producing an EUV mask blank and a method for producing a reflective mask of the present invention, wherein the glass substrate-holding tool of the present invention is used as a tool for holding a glass substrate, it is possible to produce an EUV mask blank and a reflective mask, which are free from scratches or foreign substances at the center portion of the rear surface.

BEST MODE FOR CARRYING OUT THE INVENTION

Now, the present invention will be described with reference to the drawings.

Figure 1:
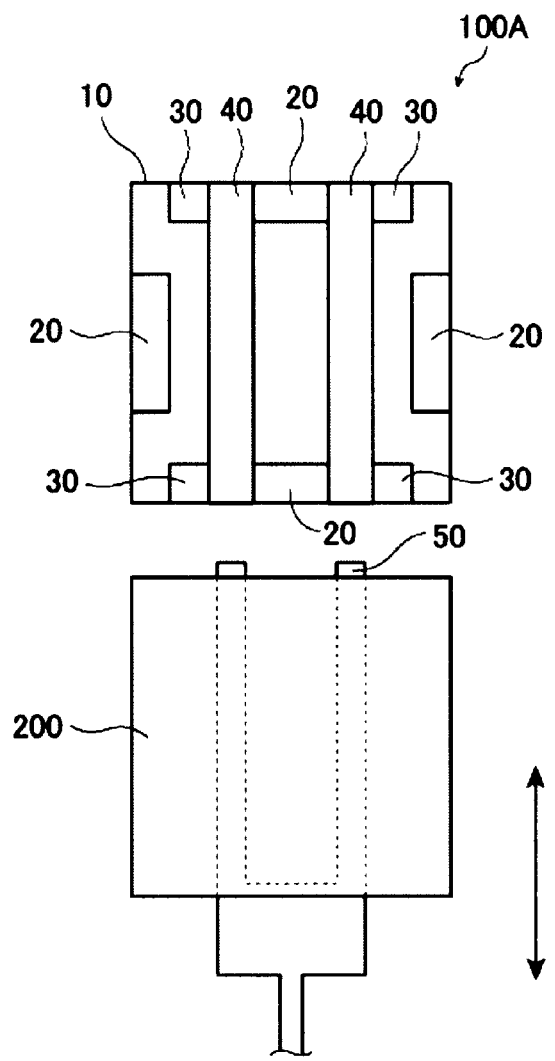
FIG. 1 is a plan view schematically illustrating a first embodiment of the glass substrate-holding tool of the present invention.
Figure 2:
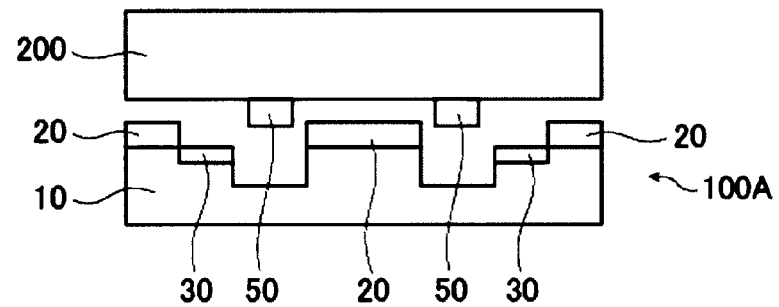
FIG. 2 is a side view of the glass substrate-holding tool shown in FIG. 1 and schematically illustrates a state at the time of carrying in or out the glass substrate.
Figure 3:
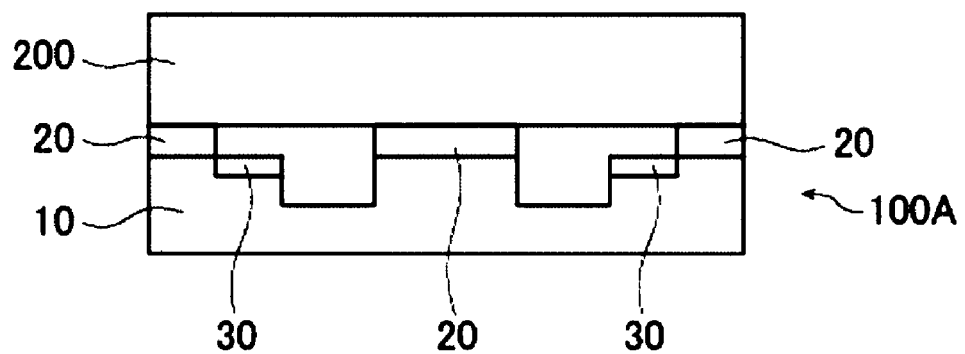
FIG. 3 is a side view of the glass substrate-holding tool shown in FIG. 1 and schematically illustrates a state at the time of holding the glass substrate.
Figure 4:
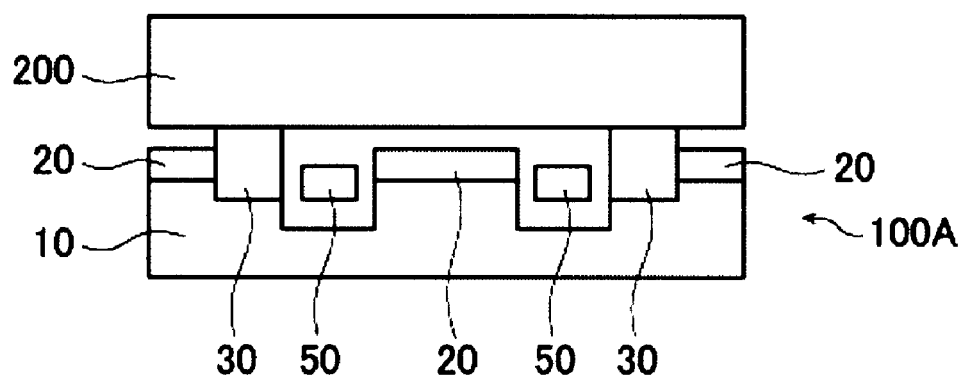
FIG. 4 is a side view of the glass substrate-holding tool shown in FIG. 1 and schematically illustrates a state at the time of detaching the glass substrate.

FIG. 1 is a plan view schematically illustrating a first embodiment of the glass substrate-holding tool of the present invention. FIGS. 2 to 4 are side views of the glass substrate-holding tool shown in FIG. 1. FIG. 2 schematically illustrates a state at the time of carrying in or out the glass substrate; FIG. 3 schematically illustrates a state at the time of holding the glass substrate; and FIG. 4 schematically illustrates a state at the time of detaching the glass substrate.

In the glass substrate-holding tool 100A shown in FIGS. 1 to 4, the base 10 is a portion constituting a base board for the glass substrate-holding tool 100A. The base 10 is made of a material having a sufficient mechanical strength to hold a glass substrate 200 horizontally. The constituting material for the base 10 may, for example, be aluminum oxide, aluminum or an aluminum alloy. Such an aluminum material is preferred since it has a sufficient mechanical strength, and on the other hand, it is light in weight and easy to process and planarize.

At least the surface of the base 10 is planarized in order to hold the glass substrate 200 horizontally.

A catching portion 20 is provided at a part of the periphery of the surface of base 10. Here, the reason why the catching portion 20 is not provided along the entire periphery is that a lifting up mechanism 30 and grooves 40 to let arms 50 for transporting the substrate pass therethrough, are provided.

In FIG. 1, the arms 50 having the glass substrate 200 mounted thereon are moved to carry in the glass substrate 200 on the base 10 and to carry out the glass substrate 200 from the base 10. The state at the time of carrying in or out of the glass substrate 200 is shown in FIG. 2. Catching and holding of the glass substrate are carried out as shown in FIG. 3 by lowering the glass substrate 200 and bringing the glass substrate 200 and the catching portion 20 in contact with each other. At the time of detaching the glass substrate, as shown in FIG. 4, the glass substrate 200 is lifted up by the lifting up mechanism 30 to bring the glass substrate 200 and the catching portion 20 out of contact with each other.

The catching portion 20 has a surface structure and flexibility capable of catching the glass substrate 200 by van der Waals forces, when it is brought in contact with the glass substrate 200.

Figure 20:
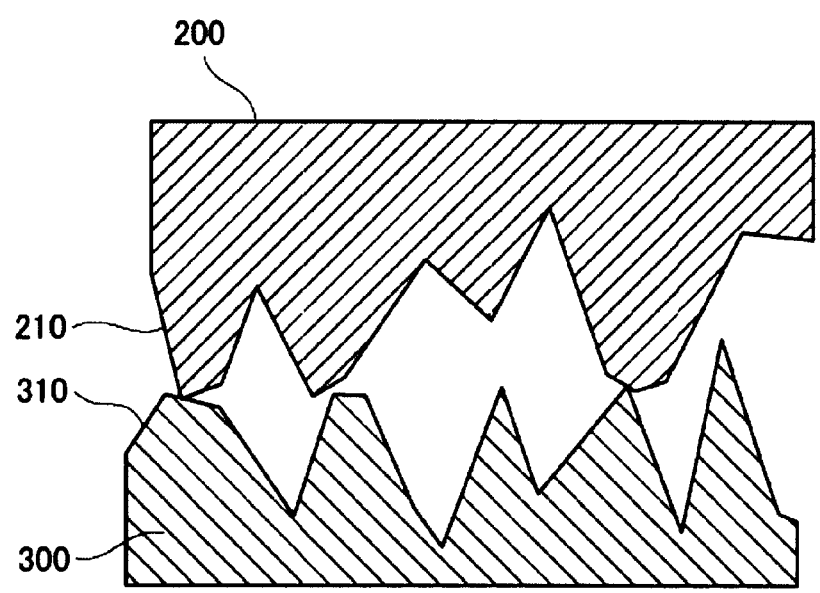
FIG. 20 is a partially enlarged cross-sectional view schematically illustrating a structure in the vicinity of the contact interface between a common substance and a glass substrate when they are brought in contact with each other.
Figure 21:
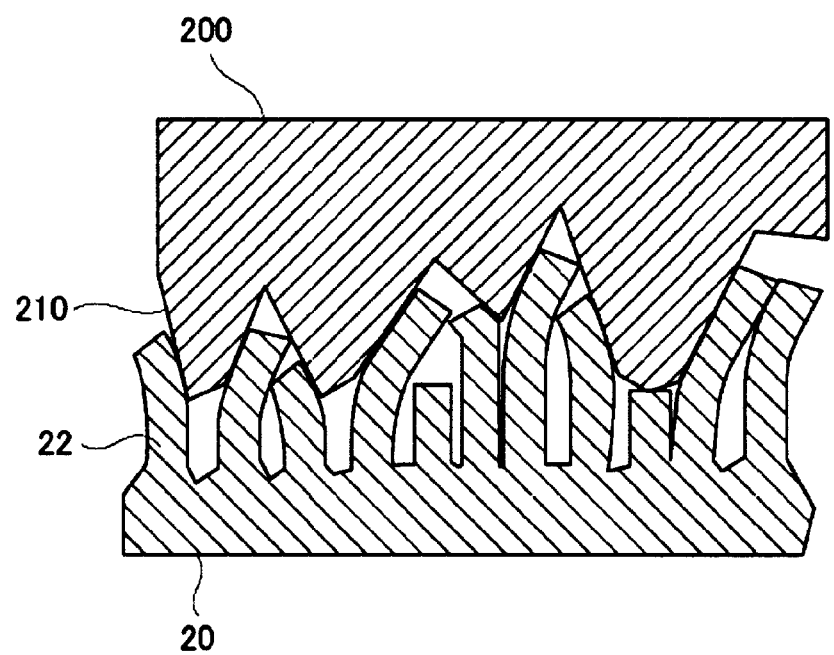
FIG. 21 is a partially enlarged cross-sectional view schematically illustrating a structure in the vicinity of the contact interface between the catching portion in the present invention and a glass substrate, when they are brought in contact with each other.

FIGS. 20 and 21 are views illustrating a surface structure required for catching the glass substrate by van der Waals forces. FIG. 20 is a partially enlarged cross-sectional view illustrating a structure in the vicinity of the contact interface between a common substance (such as a base made of the above-described aluminum material) 300 and a glass substrate 200 when they are brought in contact. FIG. 21 is a partially enlarged cross-sectional view illustrating a structure in the vicinity of the contact interface between the catching portion 20 and a glass substrate 200 when they are brought in contact with each other.

When the common substance and the glass substrate are brought in contact with each other, in order to let van der Waals forces work between the two, it is preferred that the intermolecular distance between the molecules constituting the substance and the molecules constituting the glass substrate is made to be from 1 to 5 Å. Here, as shown in FIG. 20, on the surface of the common substance 300, fine irregularities 310 of μm order are present. The same is true also with the glass substrate 200, and fine irregularities 210 of μm order are present on its surface. Therefore, when the common substance 300 and the glass substrate 200 are brought in contact with each other, the irregularities 310 present on the surface of the substance 300 and the irregularities 210 present on the surface of the glass substrate 200 will collide with each other, and they become a point contact state at their contact interface. Accordingly, the area of portions where the intermolecular distance between the molecules constituting the material 300 and the molecules constituting the glass substrate 200 is close to from 1 to 5 Å, is very small. Therefore, van der Waals forces of the substance 300 to the glass substrate 200 do not substantially work, and the glass substrate 200 will not be attracted or catched by the substance 300. Whereas, as shown in FIG. 21, the surface of the catching portion 20 has such a structure that many pillars 22 having, for example, a length of 1 μm with a diameter of about 200 nm are transplanted like bristles of gecko's hands. In other words, on the surface of the catching portion 20, fine pillars are densely present. Therefore, when the glass substrate 200 and the catching portion 20 are brought in contact with each other, such pillars 22 yield to fine irregularities of μm order present on the surface of the glass substrate 200, whereby at the contact interface between them, the irregularities 210 and the pillars 22 will be in a surface contact state. Consequently, the area of portions where the intermolecular distance between the molecules constituting the catching portion 20 and the molecules constituting the glass substrate 200 is close to from 1 to 5 Å, becomes very large. Accordingly, van der Waals forces of the catching portion 20 to the glass substrate 200 work so that the glass substrate 200 is attracted or catched by the catching portion 20.

In the glass substrate-holding tool of the present invention, in order to effectively obtain van der Waals forces, the catching portion preferably has such a structure that it has, at its surface, pillars having lengths of preferably from 0.1 nm to 2,000 nm, more preferably from 1 nm to 300 nm, further preferably from 10 nm to 200 nm, diameters of preferably at most 400 nm, more preferably from 2 nm to 30 nm, further preferably from 3 nm to 20 nm, and aspect ratios of preferably at least 2.5, more preferably from 5 to 50, further preferably from 10 to 30, at a density of preferably from $10^5$ to $10^{12}$ pillars/cm$^2$, more preferably from $10^6$ to $10^{11}$ pillars/cm$^2$.

However, FIG. 21 shows an example of the surface structure of the catching portion, and the surface structure of the catching portion in the glass substrate-holding tool of the present invention is not limited thereto. That is, it may be a structure such that when the glass substrate and the catching portion are brought in contact with each other, the surface of the catching portion deforms along the fine irregularities of μm order present on the surface of the glass substrate so that the area of portions where the intermolecular distance between the molecules constituting the catching portion and the molecules constituting the glass substrate is close to from 1 to 5 Å, becomes large, and van der Waals forces of the catching portion work to the glass substrate.

With the catching portion of a structure where van der Waals forces are provided by the above-described mechanism, when the glass substrate and the catching portion are brought in contact with each other, the surface of the catching portion deforms along the fine irregularities of μm order present on the surface of the glass substrate, whereby the planarity of the catching portion to the glass substrate becomes better than the appearance, and uniformity of the catching force becomes higher.

Here, the catching portion 20 having a surface structure and flexibility capable of catching the glass substrate 200 by van der Waals forces when it is brought in contact with the glass substrate 200, may be formed by using at least one polymer resin such as a silicone resin, a polyimide resin, a polyester resin, a fluororesin, a (meth)acrylic resin, a polyolefin resin (e.g. a polyethylene resin), a polyvinyl chloride resin, an ethylene/vinyl acetate copolymer (EVA) resin or the like.

In a case where the catching portion 20 is formed by a silicone resin, in addition to the van der Waals forces, electrostatic attraction will also work between the glass substrate 200 and the catching portion 20.

The silicone resin is excellent in electrostatic property, and when it is exposed to the air, its surface will be positively-charged. That is, most resins are negatively charged, but the silicone resin is characterized in that it is positively charged. For example, the surface potential of kapton as a resin is −0.14 kV, while the surface potential of a silicone resin is +0.11 kV.

On the other hand, the surface of the glass substrate 200 is negatively charged, and accordingly, when the glass substrate 200 and the catching portion 20 are brought in contact with each other, electrostatic attraction works between the glass substrate 200 which is negatively charged and the catching portion 20 which is positively charged. Accordingly, when the catching portion 20 is formed by a silicone resin, the glass substrate 200 will be caught by van der Waals forces and electrostatic attraction.

However, the surface potential of the silicone resin by electrification is at a level of +0.11 kV as mentioned above, which is very low as compared with the surface potential of a conventional electrostatic chuck. Accordingly, it is free from attracting foreign substances by residual charge or leaking electric field as in the case of holding the glass substrate by electrostatic chuck.

Further, the van der Waals forces and the electrostatic attraction (in a case where the surface of the catching portion is positively charged) acting between the glass substrate 200 and the catching portion 20 are very small as compared with the mechanical force for raising the lifting up mechanism 30. Accordingly, by raising the lifting up mechanism 30, the glass substrate 200 can easily be released from the catching portion 20.

In the glass substrate-holding tool 100A of the present invention, the catching portion 20 is provided only at the periphery of the surface of the base 10 in order to let the catching portion 20 be in contact only with the periphery of the glass substrate 200 thereby to prevent deposition of foreign substances at the center portion of the glass substrate 200. That is, the catching portion 20 is provided at a position in contact only with the periphery of the glass substrate 200. Specifically, when the length of one side of the glass substrate is represented by L (mm), the catching portion 20 is provided at a position in contact with only the periphery of the glass substrate with a distance of at most 1/5 L from the edge of the glass substrate.

In the glass substrate-holding tool of the present invention, it is preferred that the catching portion 20 is provided at a position in contact with only the periphery of the glass substrate with a distance of at most 1/10 L from the edge of the glass substrate, and it is more preferred that the catching portion 20 is provided at a position in contact with only the periphery of the glass substrate with a distance of at most 3/100 L from the edge of the glass substrate.

The glass substrate-holding tool of the present invention exhibits a sufficient catching force to hold the glass substrate 200, when the glass substrate 200 is brought in contact with a catching portion 20. Specifically, when the mass of the glass substrate is represented by T (g), the substrate-catching force F (gf) by the catching portion is required to satisfy the following formula (1).

$$F = \alpha \times T \qquad (1)$$

In the formula (1), $\alpha$ is $1 \leq \alpha \leq 200$.

Here, if $\alpha < 1$, the substrate-catching force tends to be inadequate, displacement or falling of a glass substrate is likely to occur during the production of an EUV mask blank, during patterning of the absorptive layer which is carried out at the time of preparing a reflective mask from an EUV mask blank, or at the time of handling the reflective mask during the exposure in an EUV lithography.

On the other hand, if $\alpha \geq 200$, the substrate catching force tends to be too large, and releasing the glass substrate from the catching portion tends to be difficult.

In the above formula (1), a is preferably $1.2 \leq \alpha \leq 100$, more preferably $1.5 \leq \alpha \leq 50$, particularly preferably $1.7 \leq \alpha \leq 10$.

The substrate-catching force F by the catching portion satisfies a relation shown by the following formula (2) between the catching force $F_0$ per unit surface area (gf/mm$^2$) of the catching portion and the total contact area S (mm$^2$) of the catching portion to the glass substrate.

$$F = F_0 \times S \qquad (2)$$

Accordingly, the catching force $F_0$ per unit surface area of the catching portion and the total contact area S of the catching portion to the glass substrate may be selected so that the substrate-catching force F by the catching portion satisfies the above formula (1).

For example, in a case where a glass substrate to be held is a glass substrate of 152.4 mm×152.4 mm which is commonly used as a substrate for an EUV mask blank, its mass is about 330 g. Here, in a case where as the catching portion, a silicone resin having a catching force $F_0$ per unit surface area of 4 gf/mm$^2$ is used, the total contact area S of the catching portion required at a minimum becomes 82.5 mm$^2$ from the above formulae (1) and (2).

Further, in a case where a glass substrate of 152.4 mm×152.4 mm which is commonly used as a substrate for an EUV mask blank, is to be held, a sufficient catching force to hold the glass substrate can be obtained by using a catching portion having a catching force $F_0$ per unit surface area of from 0.0225 gf/mm$^2$ to 16.5 gf/mm$^2$ and setting the total contact area S of the catching portion to the glass substrate so as to satisfy the above formulae (1) and (2). Specifically, in a case where the catching force $F_0$ per unit surface area is 0.0225 gf/mm$^2$, the total contact area S of the catching portion to the glass substrate may be at least 14667 mm$^2$, and in a case where the catching force $F_0$ per unit surface area is 16.5 gf/mm$^2$, the total contact area S of the catching portion to the glass substrate may be at least 20 mm$^2$. In a case where the catching force $F_0$ per unit surface area is more than 0.0225 gf/mm$^2$ and less than 16.5 gf/mm$^2$, the total contact area S of the catching portion to the glass substrate may suitably be selected in accordance with the above concept.

The catching force $F_0$ per unit surface area is more preferably from 0.1 gf/mm$^2$ to 12 gf/mm$^2$, further preferably from 1 gf/mm$^2$ to 7 gf/mm$^2$, particularly preferably from 3 gf/mm$^2$ to 5 gf/mm$^2$.

The glass substrate-holding tool of the present invention has been described with reference to the glass substrate-holding tool 100A shown in FIGS. 1 to 4. However, so long as the following conditions (a) and (b) are satisfied, the position of the catching portion is not limited to the embodiment shown in the drawing.

(a) The catching portion is provided at a position in contact with only the periphery of the glass substrate with a distance of at most 1/5 L from the edge of the glass substrate.

(b) The substrate-catching force F by the catching portion satisfies the above formula (1).

Figure 5:
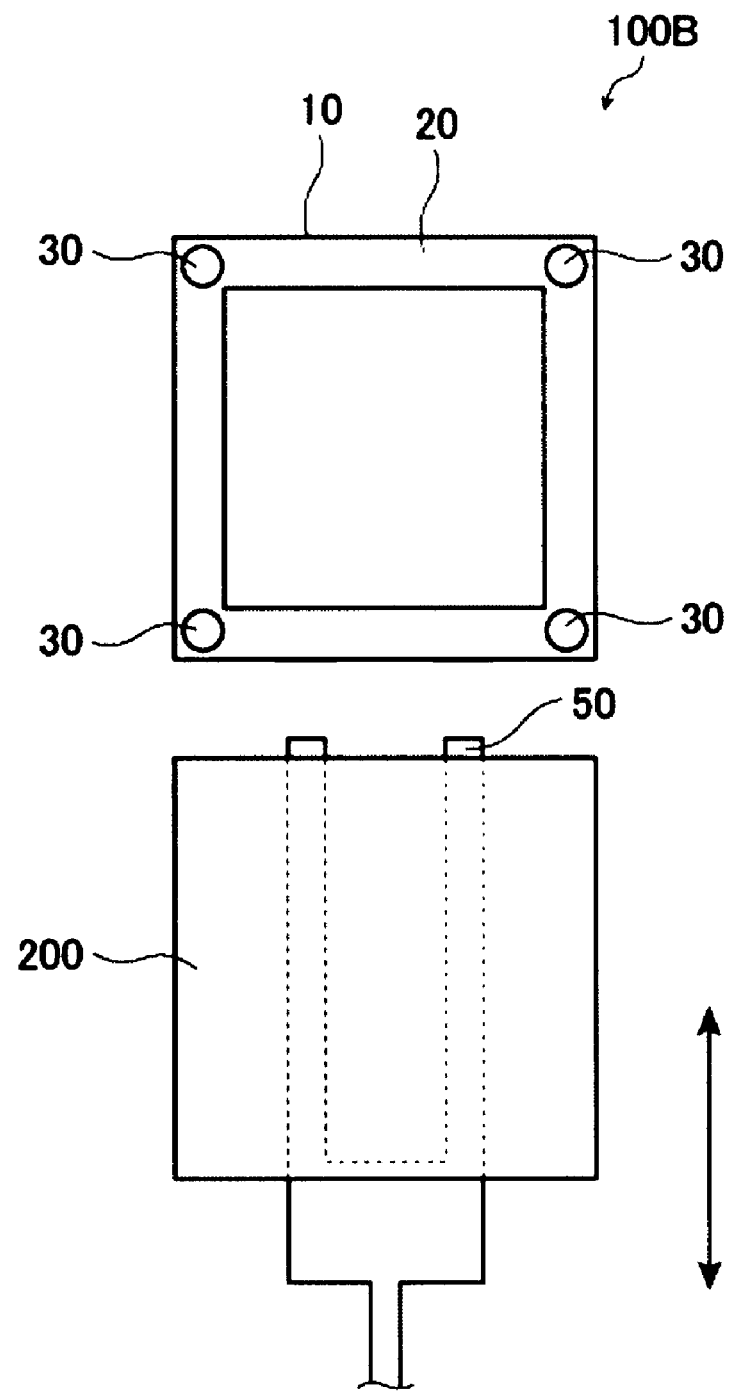
FIG. 5 is a plan view schematically illustrating another embodiment of the glass substrate-holding tool of the present invention.
Figure 6:
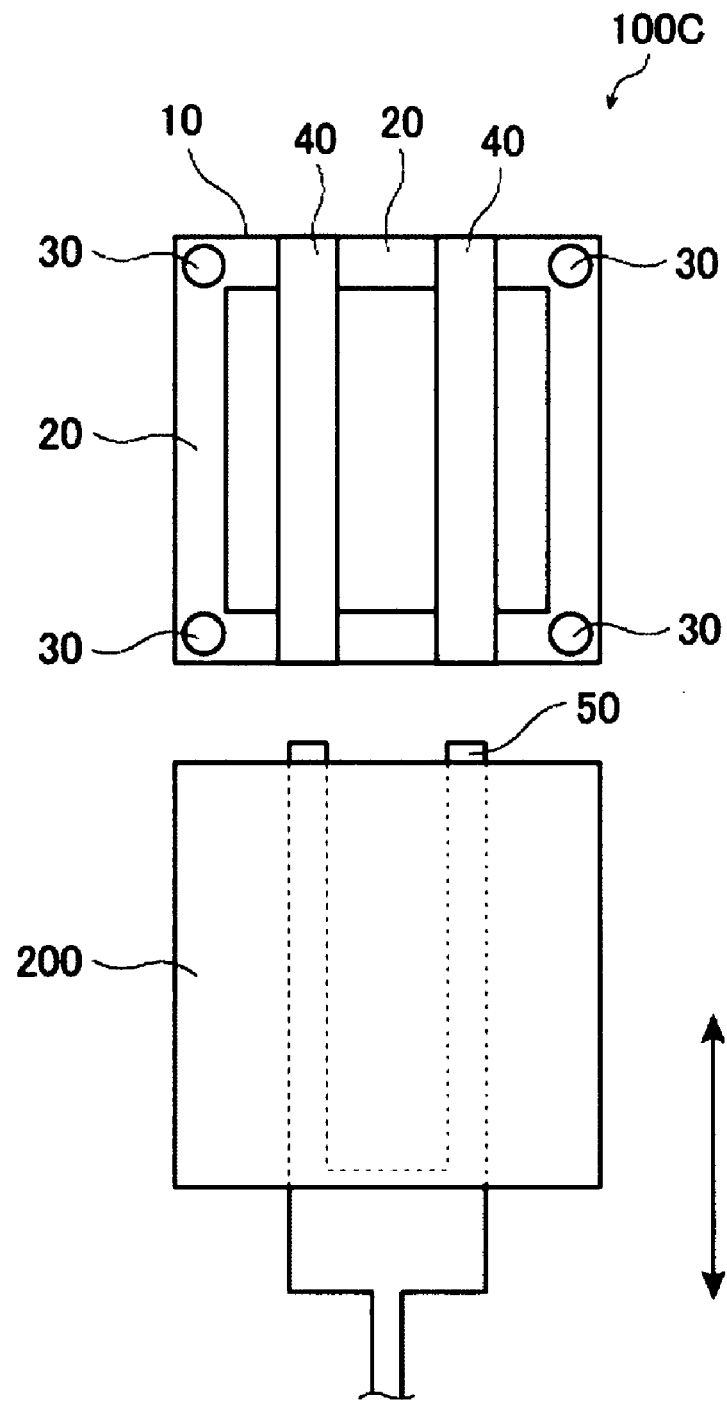
FIG. 6 is a plan view schematically illustrating still another embodiment of the glass substrate-holding tool of the present invention.
Figure 7:
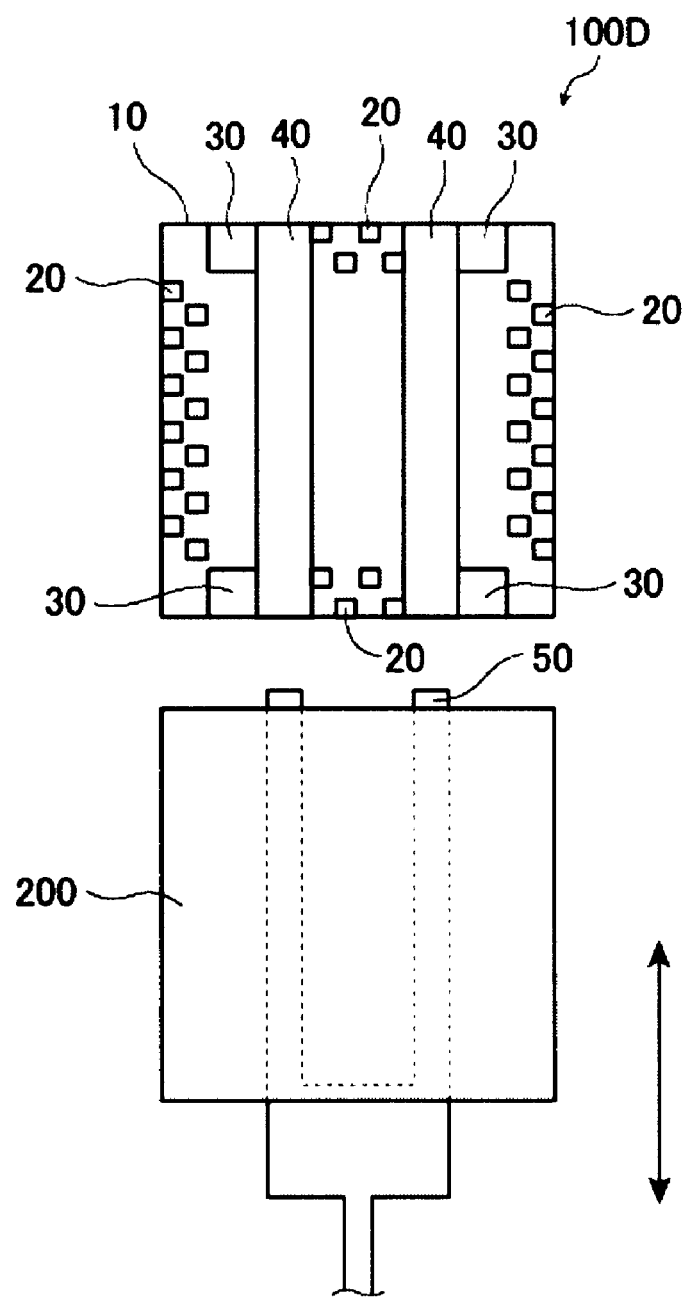
FIG. 7 is a plan view schematically illustrating still another embodiment of the glass substrate-holding tool of the present invention.

FIGS. 5 to 7 are plan views schematically illustrating variations in the disposition of the catching portion in the glass substrate-holding tool of the present invention.

In the glass substrate-holding tool 100B shown in FIG. 5, the catching portion 20 is provided along the entire periphery of the base 10, and the lifting up mechanisms 30 are provided at the four corners of the base 10 in a shape enclosed by the catching portion 20. The base 10 is not provided with grooves in which arms 50 for transporting the substrate pass therethrough, but such a disposition of the catching portion is possible in a case where the glass substrate 200 can be lifted by the lifting up mechanisms 30 to a sufficient height so that the arm 50 can pass through above the base 10.

Further, disposition of the lifting up mechanisms on the base is not particularly limited so long as the glass substrate can be moved in the up and down direction while keeping the horizontal state without being inclined and so long as the movement of arms for transporting the substrate or the catching of the glass substrate by the catching portion is not hindered, and the disposition may be other than one disclosed in the drawings.

The glass substrate-holding tool 100C shown in FIG. 6 resembles the glass substrate-holding tool 100B shown in FIG. 4 in the disposition of the catching portion 20 and the lifting up mechanisms 30. However, in the glass substrate-holding tool 100C, grooves 40 are provided on the base 10 to let arms 50 for transporting the substrate pass therethrough. It is preferred to provide grooves 40 on the base 10 to let the arms 50 pass therethrough, since at the time of carrying in or out the glass substrate 200, the movement of the glass substrate 200 in the up and down direction by the lifting up mechanisms 30 can be made small.

The glass substrate-holding tool 100D shown in FIG. 7 resembles the glass substrate-holding tool 100A shown in FIG. 1 in the disposition of the lifting up mechanisms 3 on the base 10 and in the disposition of the grooves 40 to let arms 50 for transporting the substrate pass therethrough. However, it has a structure wherein many small catching portions 20 are disposed in a dotted fashion on the base 10. It may have such a structure so long as the substrate-catching force F as the entirety of such catching portions satisfies the above formula (1).

Figure 8:
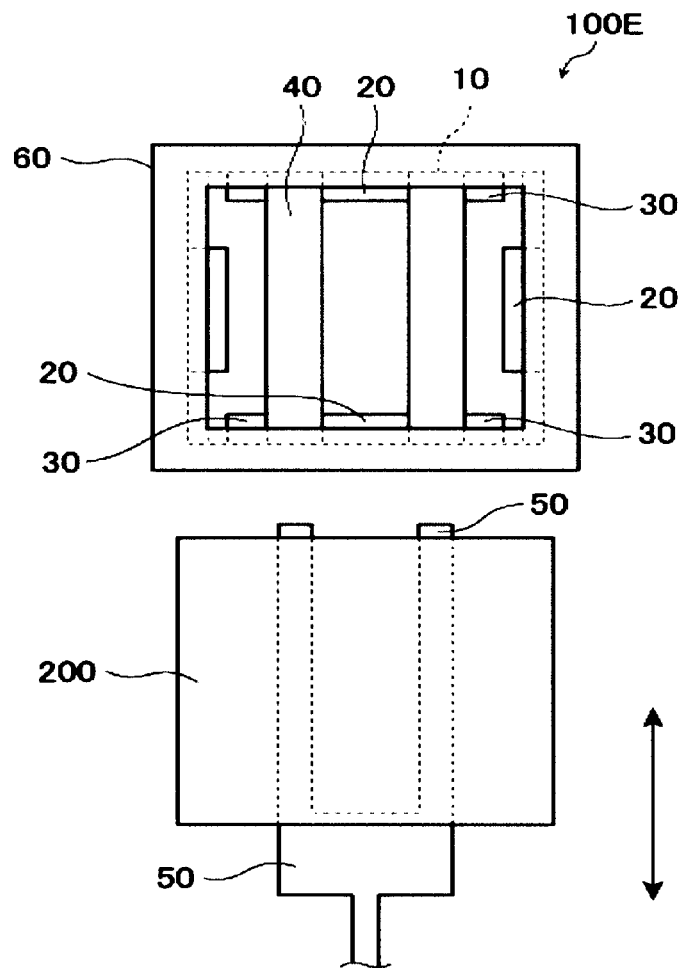
FIG. 8 is a plan view schematically illustrating still another embodiment of the glass substrate-holding tool of the present invention.
Figure 9:
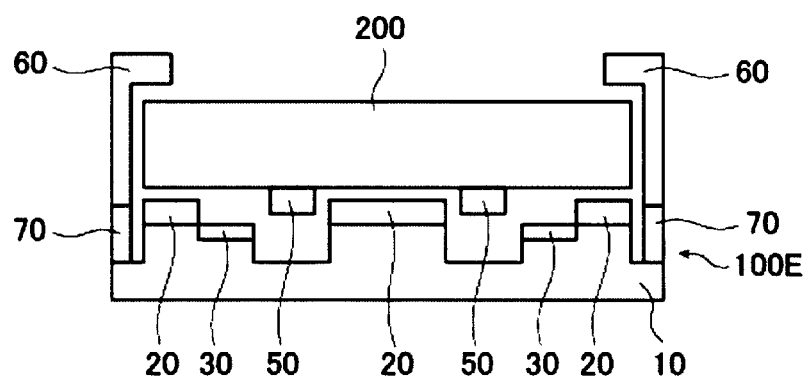
FIG. 9 is a side view of the glass substrate-holding tool shown in FIG. 8 and schematically illustrates a state at the time of carrying in or out the glass substrate.
Figure 10:
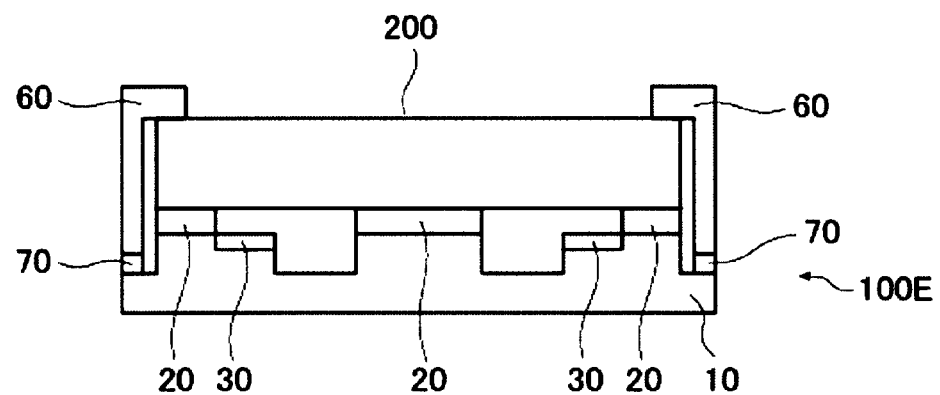
FIG. 10 is a side view of the glass substrate-holding tool shown in FIG. 8 and schematically illustrates a state at the time of holding the glass substrate.
Figure 11:
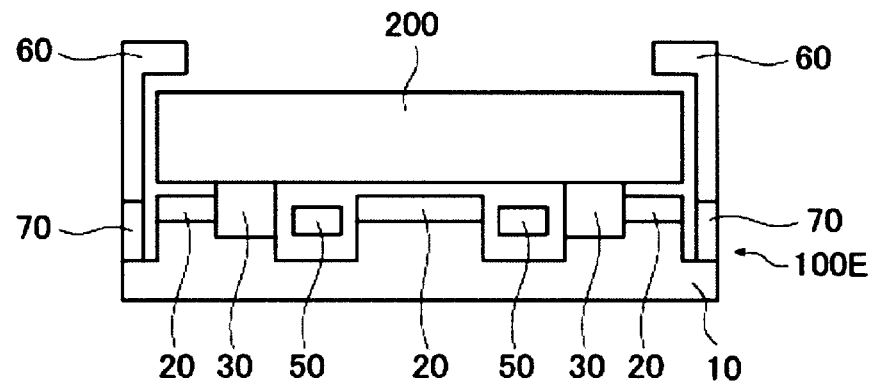
FIG. 11 is a side view of the glass substrate-holding tool shown in FIG. 8 and schematically illustrates a state at the time of detaching the glass substrate.

When used for holding a glass substrate in the production of an EUV mask blank, the glass substrate-holding tool of the present invention preferably has a shielding component to cover the side surface of the glass substrate and the periphery of the upper surface of the glass substrate. FIG. 8 is a plan view schematically illustrating the glass substrate-holding tool of the present invention having such a shielding component. FIGS. 9 to 11 are side views of the glass substrate-holding tool shown in FIG. 8. FIG. 9 schematically illustrates a state at the time of carrying in or out the glass substrate. FIG. 10 schematically illustrates a state at the time of holding the glass substrate. FIG. 11 schematically illustrates a state at the time of detaching the glass substrate.

The glass substrate-holding tool 100E shown in FIGS. 8 to 11 has the same structure as the glass substrate-holding tool 100A shown in FIGS. 1 to 4 except that it has a shielding component 60 to cover the side surface of the glass substrate 200 and the periphery of the upper surface of the glass substrate 200 at the time of holding the glass substrate 200, and lifting up mechanisms 70 to move the shielding component 60 in an up and down direction.

In the glass substrate-holding tool 100E shown in FIGS. 8 to 11, the side surface of the glass substrate 200 and the periphery of the upper surface of the glass substrate 200 are covered by the shielding component 60, whereby film deposition on these sites can be prevented at the time of producing an EUV mask blank in the after-described procedure.

The shielding component 60 is effective to prevent film deposition on the side surface of the glass substrate 200 and on the periphery of the upper surface of the glass substrate 200, but the shielding component 60 may hinder carrying in or out of the glass substrate or detaching the glass substrate. Therefore, as shown in FIGS. 9 and 11, the shielding component 60 is raised by the lifting up mechanisms 70 so that the shielding component 60 will not be a hindrance at the time of carrying in or out the glass substrate or at the time of detaching the glass substrate.

With the glass substrate for an EUV mask blank, the entire film deposition surface of the glass substrate is not used for the formation of the mask pattern. For example, in the case of a glass substrate of 152.4 mm×152.4 mm, a quality-guaranteed region for optical properties in an EUV mask produced by using such a glass substrate is a region of 132 mm×132 mm. Therefore, at the time of preparing an EUV mask by patterning the EUV mask blank, the region on which a resist film is to be formed is a region of 142 mm×142 mm. Also in a case where a reflective layer and an absorptive layer are formed on the film deposition surface, the reflective layer and the absorptive layer may be formed in the region of 142 mm×142 mm where the resist film is formed, and film deposition at the periphery of the film deposition surface outside thereof is not desirable since such is likely to lead to film deposition on the side surface of the glass substrate.

Further, at the periphery of the film deposition surface of the glass substrate, a chamfered portion or notched mark may be provided to facilitate recognition of the front or rear side of the glass substrate, but if a film is deposited on an angular chamfered portion or notched mark, the film is likely to be peeled, and the peeled film material causes film deposition on the side surface of the substrate or it becomes a source for formation of a defect in a mask blank to be produced, such being undesirable.

Further, in an automatic transporting mechanism to optically detect the substrate from a side surface of the glass substrate, which is introduced in a process for producing a photomask, such detection of the substrate can be smoothly carried out if there is no film deposition on the side surface of the glass substrate. Also from this viewpoint, film deposition on the periphery of the film deposition surface is not desirable, since such is likely to lead to film deposition on the side surface of the glass substrate.

By the glass substrate-holding tool 100E shown in FIGS. 8 to 11, it is possible to suppress film deposition on the side surface of the glass substrate and on the periphery of the upper surface (i.e. the film deposition surface) of the glass substrate, whereby it is possible to solve the above-described problem due to film deposition on the periphery of the film deposition surface of the glass substrate and on the side surface of the glass substrate.

In the glass substrate-holding tool 100E shown in FIGS. 8 to 11, the width of the portion covered by the shielding component 60 (the distance from the edge of the glass substrate 200) on the upper surface of the glass substrate 200 is preferably from 1 to 9 mm. When the width of the portion to be covered by the shielding component 60 on the upper surface of the glass substrate 200 is within the above range, in the production of an EUV mask blank, it is possible to minimize film deposition on the periphery of the film deposition surface of the glass substrate and on the side surface of the glass substrate. Further, in a case where a chamfered portion or notched mark is provided on the periphery of the film deposition surface of the glass substrate, it is possible to prevent film deposition on the chamfered portion or notched mark.

The width of the portion covered by the shielding component 60 in the upper surface of the glass substrate 200 is more preferably from 3 to 7 mm, further preferably from 4 to 6 mm.

In the glass substrate-holding tool having a shielding component of a structure to cover the side surface of a glass substrate, like the glass substrate-holding tool 100E, the above-described catching portion (i.e. a catching portion to catch and hold a glass substrate by van der Waals forces) may be provided on the shielding component, specifically at a position in contact with the side surface of the glass substrate at the time of holding the glass substrate. Such a catching portion functions as a side surface-catching portion to catch and hold the side surface of the glass substrate.

Figure 12:
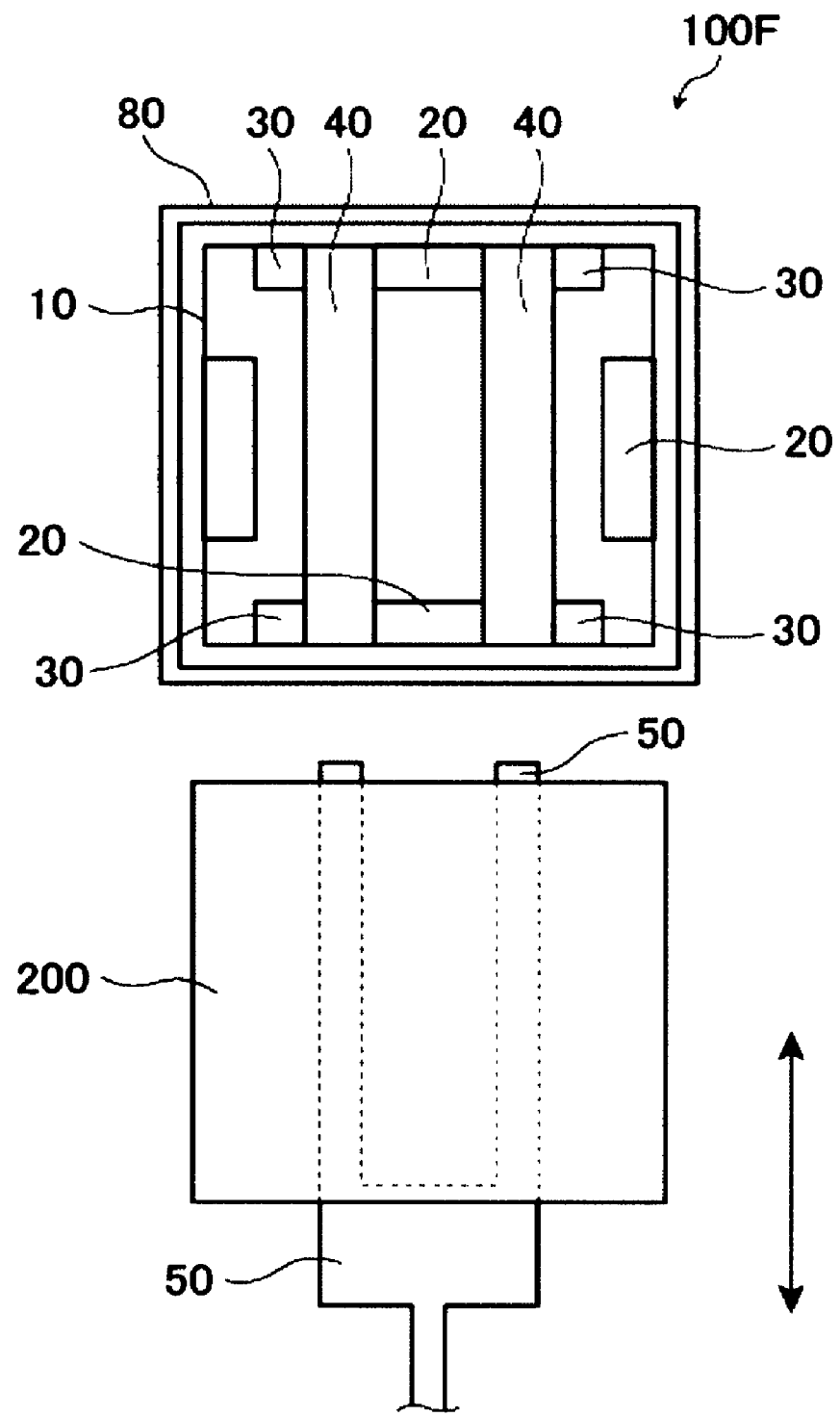
FIG. 12 is a plan view schematically illustrating still another embodiment of the glass substrate-holding tool of the present invention.

FIGS. 12 to 15 are views schematically illustrating a glass substrate-holding tool having such a side surface-catching portion. FIG. 12 is a plan view schematically illustrating the glass substrate-holding tool. Here, to clearly show the disposition of the side surface-catching portion 80, the shielding component 60 having the same structure as the glass substrate-holding tool 100E is omitted.

Figure 13:
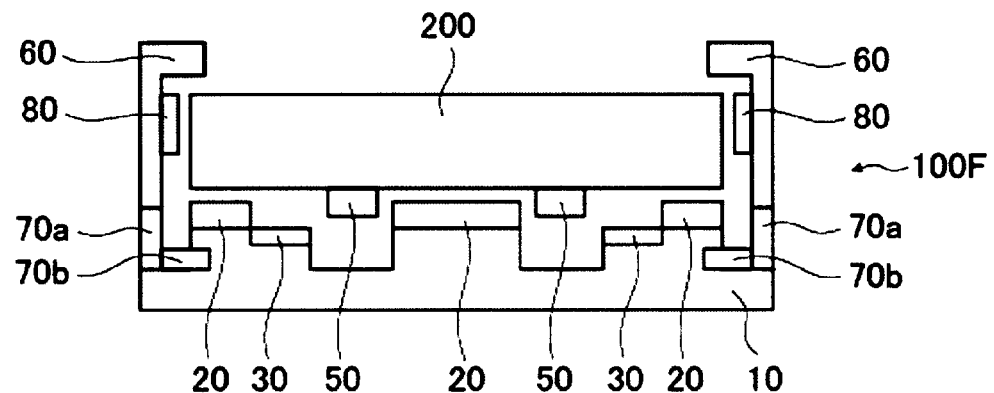
FIG. 13 is a side view of the glass substrate-holding tool shown in FIG. 12 and schematically illustrates a state at the time of carrying in or out the glass substrate.
Figure 14:
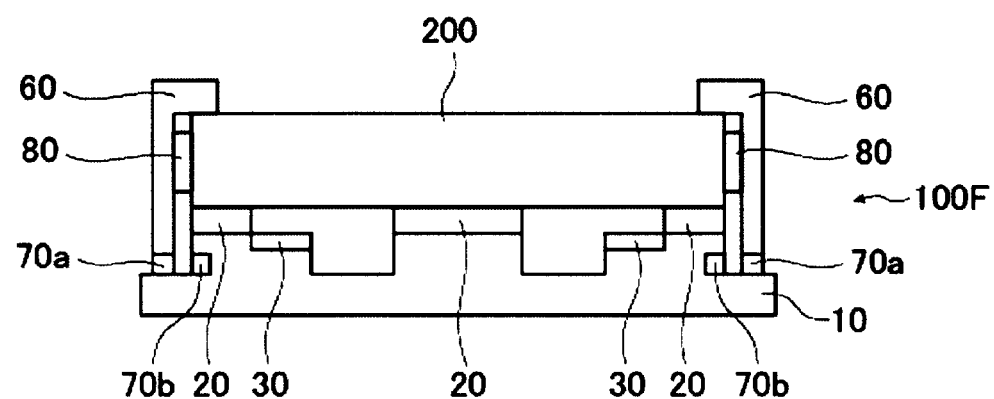
FIG. 14 is a side view of the glass substrate-holding tool shown in FIG. 12 and schematically illustrates a state at the time of holding the glass substrate.
Figure 15:
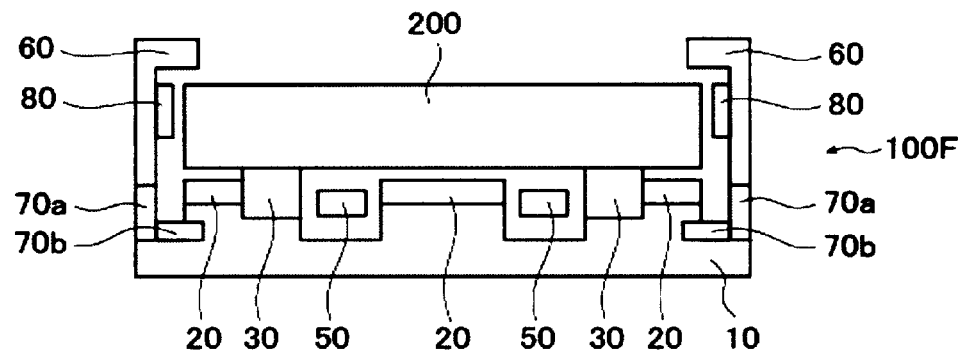
FIG. 15 is a side view of the glass substrate-holding tool shown in FIG. 12 and schematically illustrates a state at the time of detaching the glass substrate.

FIGS. 13 to 15 are side views of the glass substrate-holding tool shown in FIG. 12. Here, FIG. 13 schematically illustrates a state at the time of carrying in or out the glass substrate. FIG. 14 schematically illustrates a state at the time of holding the glass substrate. FIG. 15 schematically illustrates a state at the time of detaching the glass substrate.

As shown in FIG. 14, at the time of holding the glass substrate 200, the side surface-catching portion 80 provided on the shielding component 60 is in contact with the side surface of the glass substrate 200 and catches and holds the glass substrate by van der Waals forces. In the case of the glass substrate-holding tool 100F, the catching force per unit surface area of the catching portions (the catching portion 20 and the side surface-catching portion 80) and the total contact area of the catching portions (the catching portion 20 and the side surface-catching portion 80) to the glass substrate may be selected so that the total substrate-catching force totaling the substrate-catching force by the catching portion 20 and the substrate-catching force by the side surface-catching portion 80, will satisfy the above-described substrate-catching force F by the catching portion.

In the case of the glass substrate-holding tool 100F, the side surface-catching portion 80 is required not to be in contact with the side surface of the glass substrate 200 at the time of carrying in or out the glass substrate and at the time of detaching the glass substrate. For this purpose, the glass substrate-holding tool 100F has mechanisms 70b to translate the shielding component 60 in a circumferential direction in addition to the lifting up mechanisms 70a to move the shielding component 60 in an up and down direction.

Further, in the glass substrate-holding tool 100F, the side surface catching portion 80 is provided on the shielding component 60, but in the glass substrate-holding tool of the present invention, the position to provide the side surface-catching portion is not limited thereto, and it may be provided at any position so long as it is a position in contact with the side surface of the glass substrate at the time of holding the glass substrate.

Now, the process for producing an EUV mask blank of the present invention will be described.

The EUV mask blank has such a basic structure that on one surface (hereinafter referred to as a "film deposition surface") of a glass substrate, a reflective layer to reflect EUV light and an absorptive layer to absorb EUV light are formed in this order. As the reflective layer for the EUV mask blank, a multilayer reflective film is widely used which is obtained by alternately laminating a high refractive index film and a low refractive index film in a plurality of times, since it is thereby possible to accomplish a high reflectance in the EUV wavelength region.

The EUV mask blank to be produced by the method of the present invention may have various functional layers other than as described above. Specific examples of such functional groups may be a protective layer for reflective layer to be formed on the reflective layer, as the case requires, for the purpose of preventing the surface of the reflective layer from being oxidized, a buffer layer to be formed between the reflective layer and the absorptive layer, as the case requires, for the purpose of preventing the reflective layer from receiving a damage during patterning, and a low reflective layer to an inspection light for a mask pattern to be formed on the absorptive layer, as the case requires, for the purpose of improving the contrast during the inspection of the mask pattern.

Further, on the other surface of the glass substrate i.e. on the rear surface to the film deposition surface (hereinafter sometimes referred to simply as "the rear surface" in this specification), it may have a rear surface electroconductive film.

In the method for producing an EUV mask blank of the present invention, a reflective layer and an absorptive layer may be formed on a glass substrate, specifically on the film deposition surface of a glass substrate, by a dry film deposition method such as a sputtering method such as a magnetron sputtering method or an ion beam sputtering method, a CVD method or a vacuum vapor deposition method.

In the case of producing an EUV mask blank having the above-mentioned various functional films to be formed as the case requires, the above-mentioned various functional films may be formed by a dry film deposition method on the glass substrate, specifically on the film deposition surface of the glass substrate.

Further, in the case of producing an EUV mask blank having a rear surface electroconductive film, a rear surface electroconductive film may be formed by a dry film deposition method or a wet film forming method such as an electrolytic plating method, on the glass substrate, specifically on the rear surface of the glass substrate. However, in a case where a rear surface electroconductive film is formed in a state where the glass substrate is catched and held by the glass substrate-holding tool of the present invention, the rear surface electroconductive film is formed by using a dry film deposition method.

Among such film deposition methods, a suitable one may be selected for use depending on the film to be formed. However, a sputtering method such as a magnetron sputtering method or an ion beam sputtering method is preferred from such a viewpoint that a uniform film thickness can easily be obtained, and the takt time is short.

In the case of producing an EUV mask blank of the above-described basic structure by using the method for producing an EUV mask blank of the present invention, a glass substrate is catched and held by the glass substrate-holding tool of the present invention at the time of forming at least one of a reflective layer and an absorptive layer by a dry film deposition method.

In the case of producing an EUV mask blank having a rear surface electroconductive film, a glass substrate is held by the glass substrate-holding tool of the present invention at the time of forming at least one of a reflection layer, an absorptive layer and a rear surface electroconductive film by a dry film deposition method.

Therefore, only when either one of the reflective layer, the absorptive layer and the rear surface electroconductive film is formed, the glass substrate may be held by the glass substrate-holding tool of the present invention, and when the remaining two are formed, another holding tool (such as an electrostatic chuck) may be used to hold the glass substrate.

However, in order to prevent deposition of foreign substances on the surface to be held on the glass substrate, particularly deposition of foreign substances on the center portion of the surface to be held, it is preferred to hold the glass substrate by using the glass substrate-holding tool of the present invention, at the time of forming all of them.

In the case of producing an EUV mask blank having the above-described various functional films to be formed as the case requires, it is preferred to hold the glass substrate by the glass substrate-holding tool of the present invention also at the time of forming such various functional films by a dry film deposition method.

The EUV mask blank having the above-described basic structure in a state prior to forming an absorptive layer, i.e. one having a reflective layer formed on the film deposition surface of the glass substrate, is the reflective layer-provided substrate for EUVL to be produced by the method of the present invention, which constitutes a precursor for an EUV mask blank.

In the method for producing a reflective layer-provided substrate for EUVL of the present invention, a glass substrate is catched and held by means of the glass substrate-holding tool of the present invention at the time of forming a reflective layer by a dry film deposition method on the film deposition surface of the glass substrate.

Now, structural examples of the EUV mask blank to be produced by the method of the present invention will be described.

The glass substrate to be used for the production of the EUV mask blank satisfies the properties as the substrate for an EUV mask blank. The glass substrate has a low thermal expansion coefficient (preferably $0\pm1.0\times10^{-7}/°$ C., more preferably $0\pm0.3\times10^{-7}/°$ C., further preferably $0\pm0.2\times10^{-7}/°$ C., still further preferably $0\pm0.1\times10^{-7}/°$ C., particularly preferably $0\pm0.05\times10^{-7}/°$ C.) and is preferably excellent in smoothness, planarity and durability against a cleaning liquid to be used for cleaning a mask blank or a photomask after forming a pattern. Specifically, as the glass substrate, it is possible to use a glass having a low thermal expansion coefficient, such as a $SiO_2$—$TiO_2$ glass, but without being limited thereto, a substrate of e.g. quartz glass or crystallized glass having β-quartz solid solution precipitated, may be used.

The glass substrate preferably has a smooth surface of at most 0.15 nm rms and a planarity of at most 100 nm, whereby in a photomask after forming a pattern, a high reflectance and transfer precision can be obtained.

The size, thickness, etc. of the glass substrate are suitably determined based on the designed values, etc. for the mask. In Examples given hereinafter, a $SiO_2$—$TiO_2$ glass having a size of 6 inch (152.4 mm) square and a thickness of 0.25 inch (6.35 mm) was used.

It is preferred that no defects are present on the film deposition surface of the glass substrate. However, even when present, in order that no phase defect will be formed by concave defects and/or convex defects, the depths of the concave defects and the heights of the convex defects are preferably at most 2 nm, and the half value widths of such concave defects and convex defects are preferably at most 60 nm.

The property especially required for the reflective layer of an EUV mask blank is a high EUV light reflectance. Specifically, when a reflection layer surface is irradiated with light rays in a wavelength region of EUV light at an incident angle of 6°, the maximum value of the light ray reflectance in the vicinity of a wavelength of 13.5 nm is preferably at least 60%, more preferably at least 65%.

As a reflective layer for an EUV mask blank, a multilayer reflective film is widely used wherein a high refractive index film and a low refractive index film are alternately laminated in a plurality of times, since a high reflectance can thereby be accomplished in an EUV wavelength region. A specific example of such a multilayer reflective film may be a Mo/Si multilayer reflective film wherein a Mo film as a high refractive index film and a Si film as a low refractive index film are alternately laminated in a plurality of times.

In the case of a Mo/Si multilayer reflective film, in order to obtain a reflective layer with the maximum value of the EUV light ray reflectance of at least 60%, a Mo layer having a thickness of 2.3±0.1 nm and a Si layer having a thickness of 4.5±0.1 nm may be laminated so that the number of repeating times will be from 30 to 60.

Here, each layer to constitute the Mo/Si multilayer reflective film may be formed by a dry film deposition method, specifically a sputtering method such as a magnetron sputtering method or an ion beam sputtering method, so that the desired thickness may be obtained. For example, in the case of forming a Mo/Si multilayer reflective film by means of an ion beam sputtering method, it is preferred that a Mo layer is formed by using a Mo target as the target, using an Ar gas (gas pressure: $1.3\times10^{-2}$ Pa to $2.7\times10^2$ Pa) as the sputtering gas at an ion acceleration voltage of from 300 to 1,500 V at a film deposition rate of from 0.03 to 0.30 nm/sec to bring the thickness to be 2.3 nm, and then, a Si layer is formed by using a Si target as the target, using an Ar gas (gas pressure: $1.3\times10^{-2}$ Pa to $2.7\times10^{-2}$ Pa) as the sputtering gas at an ion acceleration voltage of from 300 to 1,500 V at a film deposition rate of from 0.03 to 0.30 nm/sec to bring the thickness to be 4.5 nm. When this operation is taken as one cycle, the Mo layer and the Si layer are laminated by from 40 to 50 cycles to obtain a Mo/Si multilayer reflective film.

The property especially required for the absorptive layer for an EUV mask blank is that the EUV light ray reflectance is extremely low. Specifically, when the absorptive layer surface is irradiated with light rays within a wavelength region of EUV light, the maximum light ray reflectance in the vicinity of a wavelength of 13.5 nm is preferably at most 0.5%, more preferably at most 0.1%.

In order to accomplish the above property, the absorptive layer is preferably made of a material having a high absorption coefficient of EUV light. As a specific example of the material having a high absorption coefficient of EUV light, a material composed mainly of tantalum (Ta) may be mentioned.

A specific example of the absorptive layer constituted by the material composed mainly of tantalum (Ta) may be an absorptive layer (TaBSiN film) containing Ta, B, Si and nitrogen (N) in the following ratio.

Content of B: at least 1 at % and less than 5 at %, preferably from 1 to 4.5 at %, more preferably from 1.5 to 4 at %

Content of Si: from 1 to 25 at %, preferably from 1 to 20 at %, more preferably from 2 to 12 at %

The compositional ratio of Ta to N (Ta:N): from 8:1 to 1:1

Content of Ta: preferably from 50 to 90 at %, more preferably from 60 to 80 at %

Content of N: preferably from 5 to 30 at %, more preferably from 10 to 25 at %

The absorptive layer (TaBSiN film) of the above composition is such that its crystal state is amorphous, and it is excellent in the surface smoothness.

With the absorptive layer (TaBSiN film) of the above composition, the surface roughness of the absorptive layer surface can be made to be at most 0.5 nm rms. If the surface roughness of the absorptive layer surface is large, the edge roughness of a pattern formed in the absorptive layer becomes large, whereby the dimensional precision of the pattern becomes poor. As the pattern becomes fine, the influence of the edge roughness becomes distinct. Therefore, the surface of the absorptive layer is required to be smooth.

When the surface roughness of the absorptive layer surface is at most 0.5 nm rms, the absorptive layer surface is sufficiently smooth, whereby there will be no deterioration of the dimensional precision of a pattern due to an influence of edge roughness.

The thickness of the absorptive layer is preferably from 50 to 100 nm. The absorptive layer (TaBSiN film) of the above composition can be formed by means of a dry film deposition method, specifically a sputtering method such as a magnetron sputtering method or an ion beam sputtering method. In a case where a magnetron sputtering method is employed, the absorptive layer (TaBSiN film) can be formed by the following methods (1) to (3).

(1) The absorptive layer (TaBSiN film) is formed by using a Ta target, a B target and a Si target and letting these individual targets discharge simultaneously in a nitrogen ($N_2$) atmosphere diluted with Ar.

(2) The absorptive layer (TaBSiN film) is formed by using a TaB compound target and a Si target and letting these targets discharge simultaneously in an $N_2$ atmosphere diluted with Ar.

(3) The absorptive layer (TaBSiN film) is formed by using a TaBSi compound target and letting this target having three elements integrated discharge in an $N_2$ atmosphere diluted with Ar.

Here, among the above methods, in a method wherein at least two targets are discharged simultaneously (method (1) or (2)), the composition of the absorptive layer to be formed can be controlled by adjusting the electric power to be applied to each target.

Among the above, methods (2) and (3) are preferred in that it is thereby possible to avoid instability of the discharge or fluctuation in the composition or thickness of the film, and method (3) is particularly preferred. With the TaBSi compound target, its composition preferably comprises from 50 to 94 at % of Ta, from 5 to 30 at % of Si and from 1 to 20 at % of B, whereby it is possible to avoid instability of the discharge or fluctuation in the composition or thickness of the film, such being particularly preferred.

Formation of the absorptive layer (TaBSiN film) by the above exemplified methods may specifically be carried out under the following film deposition conditions. METHOD (2) USING TaB COMPOUND TARGET AND Si TARGET Sputtering gas: a mixed gas of Ar and $N_2$ ($N_2$ gas concentration: from 3 to 80 vol %, preferably from 5 to 30 vol %, more preferably from 8 to 15 vol %; gas pressure: from $1.0 \times 10^{-1}$ Pa to $10 \times 10^{-1}$ Pa, preferably from $1.0 \times 10^{-1}$ Pa to $5 \times 10^{-1}$ Pa, more preferably from $1.0 \times 10^{-1}$ Pa to $3 \times 10^{-1}$ Pa)

Electric power applied (to each target): from 30 to 1,000 W, preferably from 50 to 750 W, more preferably from 80 to 500 W Film deposition rate: from 2.0 to 60 nm/sec, preferably from 3.5 to 45 nm/sec, more preferably from 5 to 30 nm/sec
METHOD (3) USING TaBSi COMPOUND TARGET Sputtering gas: a mixed gas of Ar and $N_2$ ($N_2$ gas concentration: from 3 to 80 vol %, preferably from 5 to 30 vol %, more preferably from 8 to 15 vol %; gas pressure: from $1.0 \times 10^{-1}$ Pa to $10 \times 10^{-1}$ Pa, preferably from $1.0 \times 10^{-1}$ Pa to $5 \times 10^{-1}$ Pa, more preferably from $1.0 \times 10^{-1}$ Pa to $3 \times 10^{-1}$ Pa)

Electric power applied: from 30 to 1,000 W, preferably from 50 to 750 W, more preferably from 80 to 500 W Film deposition rate: from 2.0 to 60 nm/sec, preferably from 3.5 to 45 nm/sec, more preferably from 5 to 30 nm/sec In a case where an electroconductive film on the rear surface is to be formed, the electrical conductivity and thickness of the constituting material are selected so that the sheet resistance will be at most 100Ω/□. The constituting material for the electroconductive film on the rear surface may be widely selected from ones disclosed in known literatures. For example, it may be a high dielectric constant material layer disclosed for example in JP-A-2003-501823 (which is incorporated in the present application by reference), specifically a material layer selected from the group consisting of silicon, TiN, molybdenum, chromium and TaSi. Further, an electroconductive film (CrN film) containing chromium and nitrogen as disclosed in JP-A-2008/072706 may be mentioned. Such a CrN film can be formed by a dry film deposition method, specifically a sputtering method such as a magnetron sputtering method or an ion beam sputtering method, a CVD method, or a vacuum vapor deposition method. In the case where such a CrN film is formed by a magnetron sputtering method, the magnetron sputtering method may be carried out by using a Cr target as the target and a mixed gas of Ar and $N_2$ as the sputtering gas, and specifically, it may be carried out under the following film deposition conditions.

Target: Cr target

Sputtering gas: a mixed gas of Ar and $N_2$ ($N_2$ gas concentration: from 3 to 45 vol %, preferably from 5 to 40 vol %, more preferably from 10 to 35 vol %; gas pressure: from $1.0 \times 10^{-1}$ Pa to $50 \times 10^{-1}$ Pa, preferably from $1.0 \times 10^{-1}$ Pa to $40 \times 10^{-1}$ Pa, more preferably from $1.0 \times 10^{-1}$ Pa to $30 \times 10^{-1}$ Pa)

Electric power applied: from 30 to 1,000 W, preferably from 50 to 750 W, more preferably from 80 to 500 W Film deposition rate: from 2.0 to 60 nm/m Now, the method for producing a reflective mask of the present invention will be described. At the time of preparing a reflective mask from an EUV mask blank, the absorptive layer of the mask blank (in a case where a low reflective layer is formed on the absorptive layer, the absorptive layer and the low reflective layer) is subjected to patterning. In the method for producing a reflective mask of the present invention, at the time of patterning this absorptive layer (in a case where a low reflective layer is formed on the absorptive layer, the absorptive layer and the low reflective layer), the glass substrate constituting the EUV mask blank is catched and held by means of the glass substrate-holding tool of the present invention.

In the method for producing a reflective mask of the present invention, the method for patterning the absorptive layer (in a case where a low reflective layer is formed on the absorptive layer, the absorptive layer and the low reflective layer) is not particularly limited, and for example, a method may be employed wherein a resist is applied on the absorptive layer (in a case where a low reflective layer is formed on the absorptive layer, the absorptive layer and the low reflective layer) to form a resist pattern, and by using it as a mask, the absorptive layer (in a case where a low reflective layer is formed on the absorptive layer, the absorptive layer and the low reflective layer) is subjected to etching. The material for the resist or the method for drawing the resist pattern may suitably be selected by taking into consideration the material, etc. of the absorptive layer (in a case where a low reflective layer is formed on the absorptive layer, the absorptive layer and the low reflective layer). The method for etching the absorptive layer (in a case where a low reflective layer is formed on the absorptive layer, the absorptive layer and the low reflective layer) is not particularly limited, and dry etching such as reactive ion etching, or wet etching may be employed. After patterning the absorptive layer (in a case where a low reflective layer is formed on the absorptive layer, the absorptive layer and the low reflective layer), the resist is removed by a removing liquid to obtain a reflective mask.

Now, the method for producing a semiconductor integrated circuit of the present invention will be described. The present invention is applicable to a method for producing a semiconductor integrated circuit by a photolithography method employing EUV light as a light source for exposure. Specifically, a substrate such as a silicon wafer coated with a resist is disposed on a stage, and the reflective mask is set on a reflective exposure apparatus constituted by combining a reflective mirror. And, EUV light from a light source is applied to the reflective mask via the reflective mirror, to let the EUV light be reflected by the reflective mask to be applied to the substrate coated with the resist. By such a pattern-transfer step, the circuit pattern is transferred onto the substrate. The substrate having the circuit pattern transferred is subjected to etching of the sensitized portion or non-sensitized portion by development, and then, the resist is removed. A semiconductor integrated circuit is produced by repeating such a process. In the present invention, at the time of exposing an object to be exposed (a substrate coated with a resist) by means of the reflective mask, a glass substrate constituting the reflective mask is held by the glass substrate-holding tool.

EXAMPLES

Now, the present invention will be described with reference to Examples, but it should be understood that the present invention is by no means restricted to such Examples.

Example 1

In Example 1, a glass substrate-holding tool 100B shown in FIG. 5 is prepared.

By a silicone resin, a catching portion 20 is formed at the periphery of the base 10 made of aluminum oxide and having a size of 6 inch (152.4 mm) square. The silicone resin used has a catching force $F_0$ per unit surface area of 4 gf/mm², and the catching portion 20 has a width of 1.5 mm and a height of 1 mm. Accordingly, the contact area S of the catching portion 20 to the glass substrate is about 902 mm². Further, from the above formula (2), the substrate-catching force F by the catching portion 20 is about 3,608 gf.

At four corners of the base 10, circular lifting up mechanisms 30 having a diameter of 1 mm are provided to release the glass substrate 200 from the catching portion 20.

By means of the glass substrate-holding tool 100B thus prepared, a glass substrate for an EUV mask blank is catched and held. For the glass substrate 200, a $SiO_2$—$TiO_2$ glass substrate having a size of 6 inch (152.4 mm) square, and a thickness of 0.25 inch (6.35 mm) is used. The mass of this glass substrate 200 is about 330 g, and the thermal expansion coefficient at 22° C. is 01° C.

In vacuum with a pressure of from 2.0 E -4($2.0 \times 10^4$)Torr, the glass substrate 200 is held for two hours while rotating the base 10 of the glass substrate-holding tool 100B at 10 rpm. By raising the glass substrate 200 by the lifting up mechanism 30, the glass substrate 200 is released from the catching portion 20 and recovered. The number of defects on the surface on the side catched and held of the glass substrate, specifically, the number of defects of at least 200 nm in the inspected region of 146 mm square of the surface, is measured before and after the catching and holding, by a commercially available defect-inspecting apparatus (M1350 manufactured by Lasertec Corporation). As a result, the number of defects of at least 200 nm increased after the catching and holding is 0.

In the same procedure as described above, the catching and holding of the glass substrate are repeated ten times, but no displacement or falling of the glass substrate from the base 10 of the catching and holding tool 100B is observed, and no deterioration of the catching retention force occurs.

Example 2

In Example 2, a glass substrate-holding tool 100C shown in FIG. 6 is prepared. A glass substrate-holding tool is prepared in the same procedure as in Example 1 except that a base 10 wherein grooves 40 with a width of 19 mm are provided to let arms 50 for transporting a substrate pass therethrough. Accordingly, the contact area S of the catching portion 20 to the glass substrate is about 788 mm², and the substrate-catching force F by the catching portion 20 is about 3,152 gf.

In the same procedure as in Example 1, catching and holding of a glass substrate are carried out, and the number of defects of at least 200 nm, increased after the catching and holding is evaluated. The result is 0 like in Example 1.

In the same procedure as above, the catching and holding of the glass substrate are repeated ten times, but no displacement or falling of the glass substrate from the base 10 of the catching and holding tool 100C is observed, and no deterioration of the catching retention force occurs.

Example 3

In Example 3, a glass substrate-holding tool 100A shown in FIGS. 1 to 4 is prepared. In the same manner as in Example 2, by using a base 10 wherein grooves 40 are provided to let arms for transporting a substrate pass therethrough, by the same silicone resin as in Examples 1 and 2, a catching portion 20 is formed at a part of the periphery of the base 10. The width of the catching portion 20 is made to be 2 mm, the height is made to be 1 mm, and the total contact area S of the catching portion 20 to the glass substrate is about 760 mm². Near the grooves 40, lifting up mechanisms 30 are provided. The substrate-catching force F by the catching portion 20 becomes about 3,040 gf.

In the same procedure as in Examples 1 and 2, the catching and holding of a glass substrate are carried out, and the number of defects of at least 200 nm increased after the catching and holding is evaluated, and the result is 0 like in Examples 1 and 2.

In the same procedure as above, the catching and holding of the glass substrate are repeated ten times, but no displacement or falling of the glass substrate from the base 10 of the catching and holding tool 100A is observed, and no deterioration of the catching retention force occurs.

Example 4

In Example 4, a glass substrate-holding tool 100D shown in FIG. 7 is prepared. In the same manner as in Examples 2 and 3, using a base 10 wherein grooves 40 are provided to let arms 50 for transporting a substrate pass therethrough, by the same silicone resin as in Examples 1 to 4, many small catching portions 20 are formed in a dotted pattern at a part of the periphery of the base 10. The width of individual catching portions is 1 mm, the length is 1 mm, the height is 0.5 mm and the total contact area S of the catching portions 20 to the glass substrate is about 500 mm². The substrate-catching force F by the catching portions 20 is about 2,000 gf. Near the grooves 40, lifting up mechanisms 30 are provided.

In the same procedure as in Examples 1 to 3, the catching and holding of a glass substrate are carried out, and the number of defects of at least 200 nm increased after the catching and holding is evaluated, and the result is 0 like in Examples 1 to 3.

In the same procedure as above, the catching and holding of the glass substrate are repeated ten times, but no displacement or falling of the glass substrate from the base 10 of the catching and holding tool 100D is observed, and no deterioration of the catching retention force occurs.

Example 5

In Example 5, a glass substrate-holding tool 100E shown in FIGS. 8 to 11 is prepared. The glass substrate-holding tool 100E has the same structure as the glass substrate-holding tool 100A except that a shielding component 60 to cover the side surface of the glass substrate 200 and the periphery of the upper surface of the glass substrate 200 at the time of holding the glass substrate 200, and lifting up mechanisms 70 to move the shielding component 60 in an up and down direction are provided. Accordingly, the substrate catching force F by the catching portion 20 becomes about 3,040 gf.

In the same procedure as in Examples 1 to 4, the catching and holding of a glass substrate are carried out, and the number of defects of at least 200 nm increased after the catching and holding is evaluated, and the result is 0 like in Examples 1 to 4.

In the same procedure as above, the catching and holding of the glass substrate are repeated ten times, but no displacement or falling of the glass substrate from the base 10 of the catching and holding tool 100E is observed, and no deterioration of the catching retention force occurs.

Example 6

In Example 6, a glass substrate-holding tool 100F shown in FIGS. 12 to 15 is prepared. The glass substrate-holding tool 100F has the same structure as the glass substrate-holding tool 100E except that in addition to the lifting up mechanisms 70a to move the shielding component 60 in an up and down direction, a mechanism 70b to move the shielding component 60 in a circumferential direction is provided, and a catching portion (a side surface-catching portion 80) by a silicone resin is provided also on the shielding component 60 to hold also the side surface of the substrate. However, the total contact area of the catching portion 20 and the side surface-catching portion 80 to the glass substrate is adjusted so that the substrate-catching force by the catching portion 20 and the substrate-catching force by the side surface-catching portion 80 become to be about 3,040 gf in total.

In the same procedure as in Examples 1 to 5, the catching and holding of a glass substrate are carried out, and the number of defects of at least 200 nm increased after the catching and holding is evaluated, and the result is 0 like in Examples 1 to 5.

In the same procedure as above, the catching and holding of the glass substrate are repeated ten times, but no displacement or falling of the glass substrate from the base 10 of the catching and holding tool 100F is observed, and no deterioration of the catching retention force occurs.

COMPARATIVE EXAMPLE 1

In Comparative Example 1, catching and holding of a glass substrate were carried out by using an electrostatic chuck having a catching and holding surface made of aluminum oxide. The flat surface shape of the catching and holding surface of the electrostatic chuck was a square shape of 143 mm×143 mm, and grooves 40 were provided to let arms 50 for transporting a substrate pass therethrough in the same manner as in the glass substrate-holding tools 100A and C to F. The contact area to the glass substrate was 15015 mm². By setting the voltage between electrodes of the electrostatic chuck to be 1,000 V, a center portion of the glass substrate was catched and held.

In the same procedure as in Examples 1 to 6, the number of defects of at least 200 nm increased after the catching and holding was evaluated, and found to be 40,000, i.e. the number of defects was larger by 40,000 as compared with Examples 1 to 6, and was a level not acceptable for application to EUV lithography.

COMPARATIVE EXAMPLE 2

Figure 16:
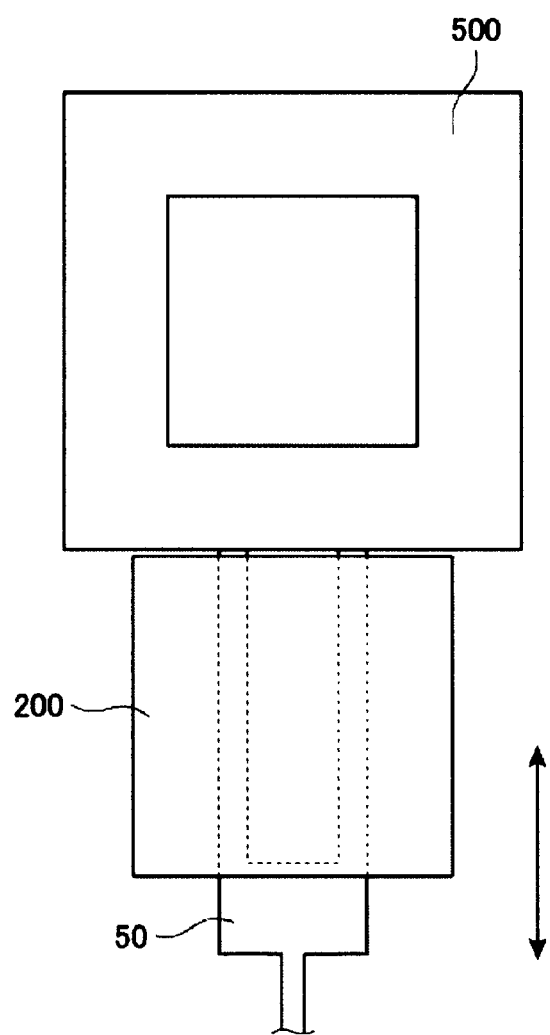
FIG. 16 is a plan view schematically illustrating a mechanical chuck used in Comparative Example 2.
Figure 17:
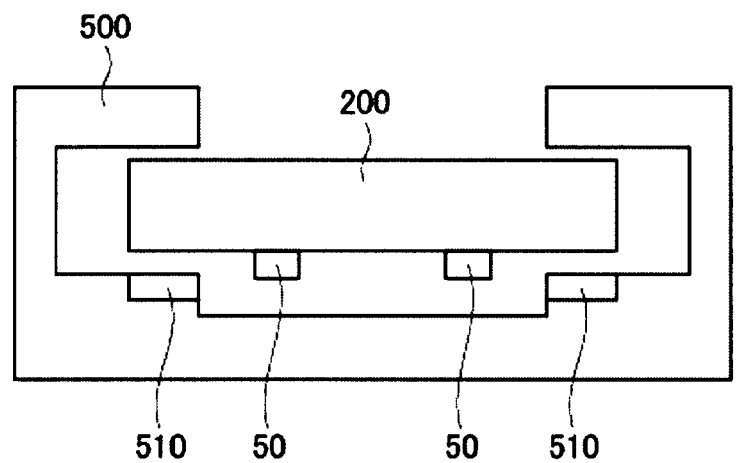
FIG. 17 is a side view of the mechanical chuck shown in FIG. 16 and schematically illustrates a state at the time of carrying in or out the glass substrate.
Figure 18:
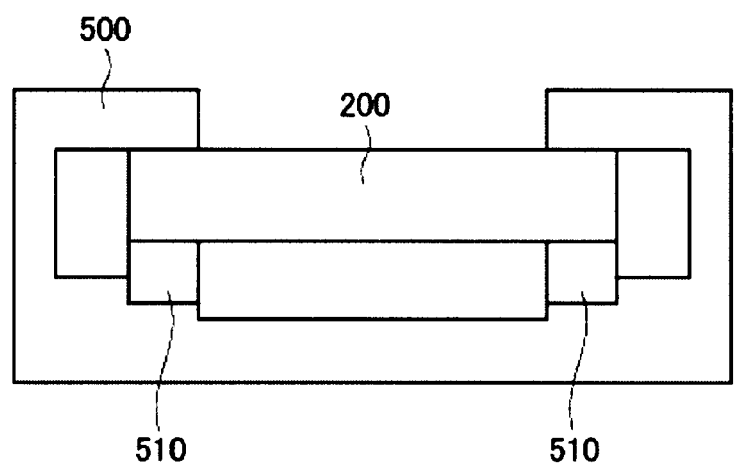
FIG. 18 is a side view of the mechanical chuck shown in FIG. 16 and schematically illustrates a state at the time of holding the glass substrate.
Figure 19:
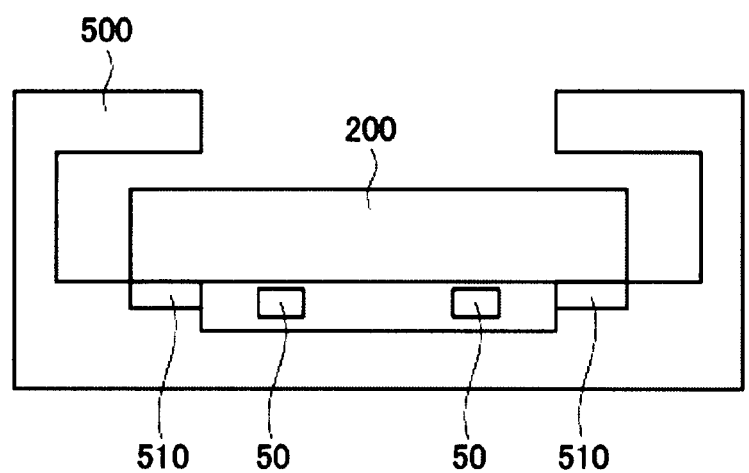
FIG. 19 is a side view of the mechanical chuck shown in FIG. 16 and schematically illustrates a state at the time of detaching the glass substrate.

In Comparative Example 2, holding of a glass substrate was carried out by using the mechanical chuck shown in FIGS. 16 to 19. FIG. 16 is a plan view schematically illustrating the mechanical chuck used in Comparative Example 2. FIGS. 17 to 19 are side views of the mechanical chuck shown in FIG. 16. FIG. 17 schematically illustrates a state of carrying in or out the glass substrate; FIG. 18 schematically illustrates a state at the time of holding the glass substrate; and FIG. 19 schematically illustrates a state at the time of detaching the glass substrate. By the mechanical chuck 500, by raising the glass substrate 200 by lifting up mechanisms 510, the glass substrate 200 is clamped and held from upper and lower directions. Here, the clamping force of the glass substrate 200 was 3,300 gf, and on the upper and lower surfaces of the glass substrate 200, sites with a distance of up to 5 mm from the edge of the glass substrate 200 were clamped.

In the same procedure as in Examples 1 to 6, the number of defects of at least 200 nm increased after the catching and holding was evaluated, and found to be 1,000, i.e. the number of defects was larger by 1,000 as compared with Examples 1 to 6, and was a level not acceptable for application to EUV lithography.

MEANING OF SYMBOLS 100A to 100F: Glass substrate-holding tools
10: Base
20: Catching portion
22: Pillar
30: Lifting up mechanism
40: Groove
50: Arm for transporting a substrate
60: Shielding component
70, 70a: Lifting up mechanism for shielding component
70b: Mechanism for transporting shielding component in circumferential direction
80: Side surface-catching portion
200: Glass substrate
210: Surface irregularities
300: Common substance
310: Surface irregularities
500: Mechanical chuck
510: Lifting up mechanism

What is claimed is:

1. A glass substrate-holding tool to catch and hold a glass substrate, which comprises a base being flat at least at its surface, and a catching portion provided on at least at a part of the base, wherein:

the catching portion has a surface structure and flexibility capable of catching the glass substrate by van der Waals forces, when it is brought in contact with the glass substrate, and the catching portion satisfies the following (a) and (b):

(a) when the length of one side of the glass substrate is represented by L (mm), the catching portion is in contact with only the periphery of the glass substrate with a distance of at most 1/5 L from the edge of the glass substrate, (b) when the mass of the glass substrate is represented by T (g), the catching force $F_0$ per unit surface area (gf/mm$^2$) of the catching portion and the total contact area S (mm$^2$) of the catching portion to the glass substrate are selected so that the substrate-catching force F (gf) by the catching portion be $F=\alpha \times T$ ($1 \leq \alpha \leq 200$).

2. A glass substrate-holding tool to catch and hold a glass substrate, which comprises a base being flat at least at its surface, and a catching portion provided on at least at a part of the base, wherein:

the catching portion has a surface structure and flexibility capable of catching the glass substrate by van der Waals forces, when it is brought in contact with the glass substrate, and the catching portion satisfies the following (c) to (e):

(c) when the length of one side of the glass substrate is represented by L (mm), the catching portion is in contact with only the periphery of the glass substrate with a distance of at most 1/5 L from the edge of the glass substrate, (d) the catching force $F_0$ per unit surface area of the catching portion is from 0.0225 to 16.5 gf/mm$^2$, (e) the total contact area S of the catching portion to the glass substrate is at least 20 mm$^2$.

3. The glass substrate-holding tool according to claim 1, wherein the catching portion has such a nature that when it is exposed to the air, its surface is positively charged.

4. The glass substrate-holding tool according to claim 2, wherein the catching portion has such a nature that when it is exposed to the air, its surface is positively charged.

5. The glass substrate-holding tool according to claim 1, wherein the catching portion is made of a silicone resin.

6. The glass substrate-holding tool according to claim 2, wherein the catching portion is made of a silicone resin.

7. The glass substrate-holding tool according to claim 1, wherein the catching portion has such a structure that it has, at its surface, pillars having lengths of from 0.1 nm to 2,000 nm, diameters of at most 400 nm and aspect ratios of at least 2.5 at a density of from $10^5$ to $10^{12}$ pillars/cm$^2$.

8. The glass substrate-holding tool according to claim 2, wherein the catching portion has such a structure that it has, at its surface, pillars having lengths of from 0.1 nm to 2,000 nm, diameters of at most 400 nm and aspect ratios of at least 2.5 at a density of from $10^5$ to $10^{12}$ pillars/cm$^2$.

9. The glass substrate-holding tool according to claim 1, which has a lifting up mechanism to lift the glass substrate up to release it from the catching portion.

10. The glass substrate-holding tool according to claim 2, which has a lifting up mechanism to lift the glass substrate up to release it from the catching portion.

11. The glass substrate-holding tool according to claim 1, which has a shielding component to cover the side surface of the glass substrate and the periphery of the upper surface of the glass substrate.

12. The glass substrate-holding tool according to claim 2, which has a shielding component to cover the side surface of the glass substrate and the periphery of the upper surface of the glass substrate.

13. The glass substrate-holding tool according to claim 1, which further has a side surface-catching portion to catch and hold the side surface of the glass substrate by van der Waals forces.

14. The glass substrate-holding tool according to claim 2, which further has a side surface-catching portion to catch and hold the side surface of the glass substrate by van der Waals forces.

15. A method for producing a reflective layer-provided substrate for EUV lithography (EUVL) having an EUV light reflective layer formed on one surface of a glass substrate, which comprises holding the glass substrate by the glass substrate-holding tool as defined in claim 1, when the reflective layer is formed on the glass substrate by a dry deposition method.

16. A method for producing a reflective layer-provided substrate for EUV lithography (EUVL) having an EUV light reflective layer formed on one surface of a glass substrate, which comprises holding the glass substrate by the glass substrate-holding tool as defined in claim 2, when the reflective layer is formed on the glass substrate by a dry deposition method.

17. A method for producing a reflective mask blank for EUV lithography (EUVL) having an EUV light reflective layer and an EUV light absorptive layer formed at least in this order on one surface of a glass substrate, which comprises holding the glass substrate by the glass substrate-holding tool as defined in claim 1, when at least one of the reflective layer and the absorptive layer is formed on the glass substrate by a dry deposition method.

18. A method for producing a reflective mask blank for EUV lithography (EUVL) having an EUV light reflective layer and an EUV light absorptive layer formed at least in this order on one surface of a glass substrate, which comprises holding the glass substrate by the glass substrate-holding tool as defined in claim 2, when at least one of the reflective layer and the absorptive layer is formed on the glass substrate by a dry deposition method.

19. A method for producing a reflective mask blank for EUV lithography (EUVL) having an EUV light reflective layer and an EUV light absorptive layer formed at least in this order on one surface of a glass substrate, and having an electroconductive film formed on the other surface of the glass substrate, which comprises holding the glass substrate by the glass substrate-holding tool as defined in claim 1, when at least one of the electroconductive film, the reflective layer and the absorptive layer is formed on the glass substrate by a dry deposition method.

20. A method for producing a reflective mask blank for EUV lithography (EUVL) having an EUV light reflective layer and an EUV light absorptive layer formed at least in this order on one surface of a glass substrate, and having an electroconductive film formed on the other surface of the glass substrate, which comprises holding the glass substrate by the glass substrate-holding tool as defined in claim 2, when at least one of the electroconductive film, the reflective layer and the absorptive layer is formed on the glass substrate by a dry deposition method.

21. A method for producing a reflective mask for EUVL, which comprises patterning an EUV light absorptive layer of a reflective mask blank for EUV lithography (EUVL) having an EUV light reflective layer and the EUV light absorptive layer formed at least in this order on one surface of a glass substrate, to obtain a reflective mask for EUVL, wherein the glass substrate is held by the glass substrate-holding tool as defined in claim 1, when the absorptive layer is patterned.

22. A method for producing a reflective mask for EUVL, which comprises patterning an EUV light absorptive layer of a reflective mask blank for EUV lithography (EUVL) having an EUV light reflective layer and the EUV light absorptive layer formed at least in this order on one surface of a glass substrate, to obtain a reflective mask for EUVL, wherein the glass substrate is held by the glass substrate-holding tool as defined in claim 2, when the absorptive layer is patterned.

23. A method for producing a semiconductor integrated circuit, which comprises exposing an object to be exposed, by means of a reflective mask for EUV lithography (EUVL) having an EUV light reflective layer and an EUV light absorptive layer formed at least in this order on one surface of a glass substrate, and having the absorptive layer patterned, to obtain a semiconductor integrated circuit, wherein the glass substrate is held by the glass substrate-holding tool as defined in claim 1, when the object to be exposed, is exposed by means of the reflective mask for EUV lithography (EUVL).

24. A method for producing a semiconductor integrated circuit, which comprises exposing an object to be exposed, by means of a reflective mask for EUV lithography (EUVL) having an EUV light reflective layer and an EUV light absorptive layer formed at least in this order on one surface of a glass substrate, and having the absorptive layer patterned, to obtain a semiconductor integrated circuit, wherein the glass substrate is held by the glass substrate-holding tool as defined in claim 2, when the object to be exposed, is exposed by means of the reflective mask for EUV lithography (EUVL).

* * * * *